(12) United States Patent
Kim

(10) Patent No.: US 10,622,307 B2
(45) Date of Patent: Apr. 14, 2020

(54) SEMICONDUCTOR DEVICE INCLUDING SWITCH CELLS

(71) Applicant: SAMSUNG ELECTRONICS CO., LTD., Suwon-si (KR)

(72) Inventor: Jong-Hyeok Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/103,450

(22) Filed: Aug. 14, 2018

(65) Prior Publication Data

US 2019/0221514 A1     Jul. 18, 2019

(30) Foreign Application Priority Data

Jan. 17, 2018   (KR) .................. 10-2018-0006167

(51) Int. Cl.
| | |
|---|---|
| *H01L 23/528* | (2006.01) |
| *H01L 23/522* | (2006.01) |
| *H01L 27/088* | (2006.01) |
| *H01L 27/02* | (2006.01) |
| *H01L 27/118* | (2006.01) |

(52) U.S. Cl.
CPC ........ *H01L 23/528* (2013.01); *H01L 23/5226* (2013.01); *H01L 27/0207* (2013.01); *H01L 27/088* (2013.01); *H01L 27/11807* (2013.01); *H01L 2027/11875* (2013.01); *H01L 2027/11881* (2013.01)

(58) Field of Classification Search
CPC . H01L 23/528; H01L 27/088; H01L 23/5226; H01L 27/0207; H01L 27/11807; H01L 2027/11881; H01L 2027/11875
See application file for complete search history.

(56) References Cited

U.S. PATENT DOCUMENTS

| | | | |
|---|---|---|---|
| 7,274,210 B2 | 9/2007 | Ogata | |
| 7,509,613 B2 | 3/2009 | Frenkil | |
| 7,590,962 B2 | 9/2009 | Frenkil et al. | |
| 9,094,011 B2 | 7/2015 | Koog et al. | |
| 2005/0200383 A1 | 9/2005 | Ogata | |
| 2006/0114025 A1 | 6/2006 | Frenkil et al. | |
| 2007/0168899 A1* | 7/2007 | Frenkil | ............... G06F 17/5068 257/773 |

(Continued)

FOREIGN PATENT DOCUMENTS

| | | |
|---|---|---|
| KR | 10-0835425 B1 | 6/2008 |
| KR | 10-0857826 B1 | 9/2008 |

*Primary Examiner* — Yasser A Abdelaziez
(74) *Attorney, Agent, or Firm* — Sughrue Mion, PLLC

(57) ABSTRACT

A semiconductor device is provided. The semiconductor device includes a first switch and second switch cells that are disposed on a substrate and spaced apart from each other; a first metal line that is electrically connected to the first switch cell; a second metal line that is electrically connected to the second switch cell; a third metal line that is interposed between the first metal line and the second metal line; a first global metal line that at least partially overlaps the first switch cell and the second switch cell in a plan view, and electrically connects the first metal line and the second metal line; and a second global metal line that is adjacent to the first global metal line in the plan view, and is electrically connected to the third metal line.

20 Claims, 19 Drawing Sheets

(56) References Cited

U.S. PATENT DOCUMENTS

| | | | | |
|---|---|---|---|---|
| 2008/0012424 | A1* | 1/2008 | Shin | G11C 5/063 |
| | | | | 307/28 |
| 2008/0137394 | A1* | 6/2008 | Shimano | G11C 5/063 |
| | | | | 365/72 |
| 2009/0184758 | A1* | 7/2009 | Motomura | H01L 27/092 |
| | | | | 327/544 |
| 2011/0113398 | A1* | 5/2011 | Keinert | G06F 17/5077 |
| | | | | 716/127 |
| 2013/0250646 | A1* | 9/2013 | Iida | G11C 11/4091 |
| | | | | 365/72 |
| 2015/0145555 | A1 | 5/2015 | Koog et al. | |
| 2015/0187642 | A1* | 7/2015 | Batra | H01L 24/24 |
| | | | | 257/774 |
| 2017/0062474 | A1 | 3/2017 | Lee | |

* cited by examiner

SEMICONDUCTOR DEVICE INCLUDING SWITCH CELLS

CROSS-REFERENCE TO RELATED APPLICATION

This application claims priority under 35 U.S.C. § 119 from Korean Patent Application No. 10-2018-0006167, filed on Jan. 17, 2018 in the Korean Intellectual Property Office, the disclosure of which is incorporated herein by reference in its entirety.

BACKGROUND

Example embodiments of the present disclosure relate to a semiconductor device, and more particularly, to an arrangement of switch cells for supplying a virtual voltage to standard cells.

A semiconductor device refers to a device implemented using a semiconductor material such as silicon (Si), germanium (Ge), gallium arsenide (GaAs), indium phosphide (InP), and the like. The semiconductor device may include a plurality of cells that may be composed of transistors that are driven using a supply power.

However, external power is not directly supplied to the standard cells. Instead, the external power is input to an element referred to as a "switch cell", which generates a virtual voltage. The virtual voltage output from the switch cell is applied to the standard cells. A sufficient virtual voltage has to be supplied to the standard cells for stable driving of a semiconductor device. In addition, a ground voltage has to be supplied to the standard cells smoothly.

However, dense placement of switch cells to supply the virtual voltage and the ground voltage to the standard cells causes an increase in the area and complicates interconnections. In this case, the performance of the semiconductor device may be reduced.

SUMMARY

One or more example embodiments provide a layout of switch cells for supplying a virtual voltage to standard cells effectively.

In accordance with an aspect of an example embodiment, there is provided a semiconductor device including: a first switch cell and a second switch cell that are disposed on a substrate and spaced apart from each other along a first direction and a second direction that is perpendicular to the first direction; a first metal line that is electrically connected to the first switch cell and extends in the second direction; a second metal line that is electrically connected to the second switch cell and extends in the second direction; a third metal line that is interposed between the first metal line and the second metal line and extends in the second direction; a first global metal line that extends in the first direction, at least partially overlaps the first switch cell and the second switch cell in a plan view, and electrically connects the first metal line and the second metal line, the first global metal line being configured to receive a power supply voltage; and a second global metal line that extends in the first direction, is adjacent to the first global metal line in the second direction in the plan view, and is electrically connected to the third metal line, the second global metal line being configured to receive a ground voltage.

In accordance with an aspect of another example embodiment, there is provided a semiconductor device including a first switch cell and a second switch cell that are disposed on a substrate and spaced apart from each other; a first global metal line that extends in a first direction and at least partially overlaps the first switch cell and the second switch cell in a plan view, the first global metal line being configured to supply a power supply voltage to the first switch cell and the second switch cell; and a second global metal line that extends in the first direction and is adjacent to the first global metal line in a second direction that is perpendicular to the first direction, the second global metal line being configured to supply a ground voltage to standard cells formed on the substrate, the second switch cell and the first switch cell being formed over different wells formed in the substrate.

In accordance with an aspect of yet another example embodiment, there is provided a semiconductor device including a first switch cell including a plurality of first transistors formed on a plurality of first N-wells, the plurality of first N-wells extending in a first direction on a substrate along a second direction perpendicular to the first direction; a second switch cell including a plurality of second transistors formed on a plurality of second N-wells, the plurality of second N-wells extending in the first direction on the substrate along the second direction; a first global metal line that extends in the first direction and at least partially overlaps the first switch cell and the second switch cell in a plan view, the first global metal line being configured to apply a power supply voltage to the first switch cell and the second switch cell; and a second global metal line that extends in the first direction and is adjacent to the first global metal line in the second direction, the second global metal line being configured to apply a ground voltage to standard cells formed on the substrate.

BRIEF DESCRIPTION OF THE DRAWINGS

The above and other aspects, features and advantages will become apparent from the following detailed description taken in conjunction with the accompanying drawings in which.

DETAILED DESCRIPTION

Figure 1:
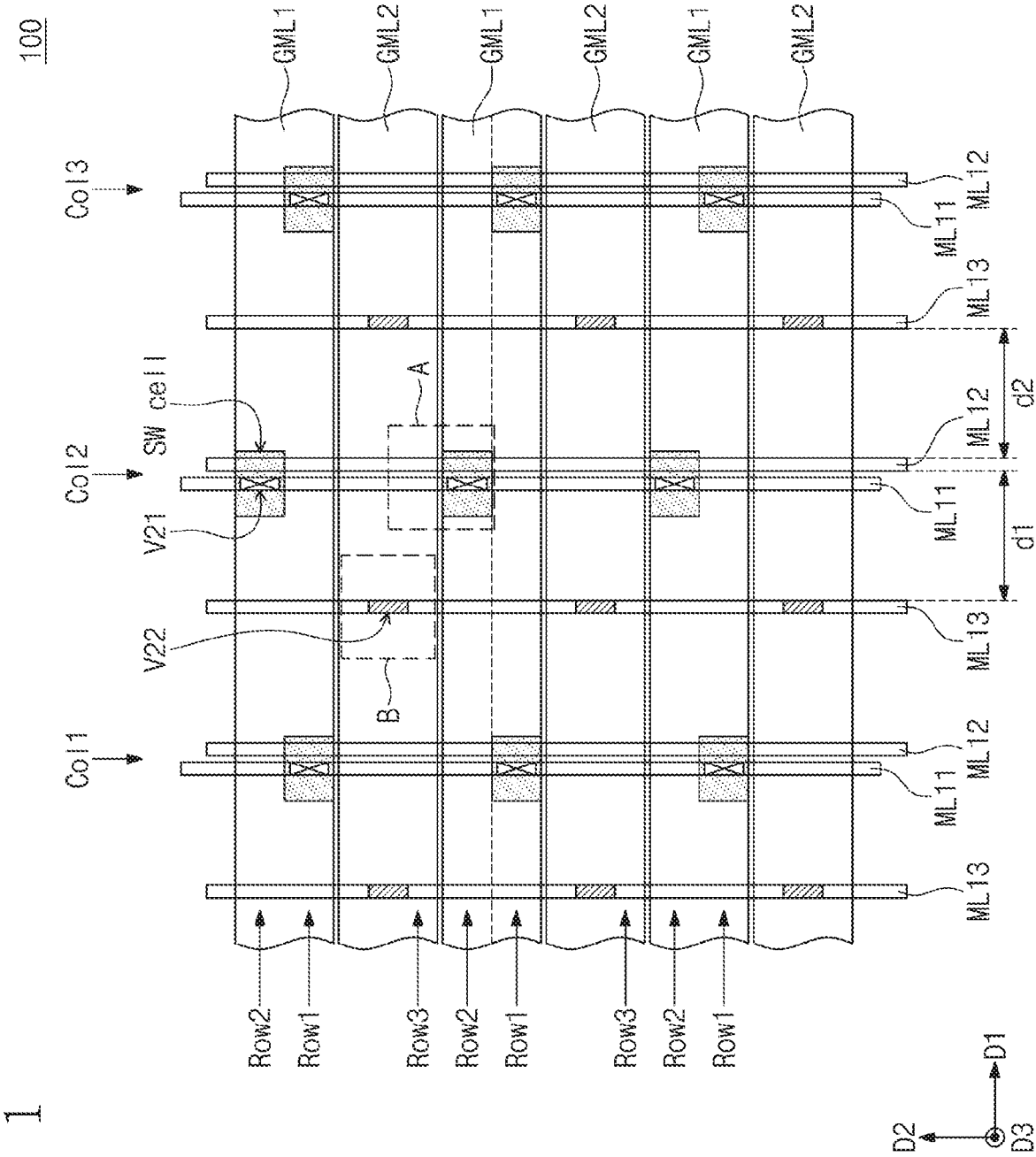
FIG. 1 is a view illustrating a layout of a semiconductor device including switch cells according to an example embodiment.

FIG. 1 is a view illustrating a layout of a semiconductor device including switch cells according to an example embodiment.

Herein, a cell may refer to various logic elements that are provided in designing a layout of a semiconductor device, manufacturing the semiconductor device, and/or testing the semiconductor device. That is, the cell may be provided from a cell library of a layout design tool. Alternatively or additionally, the cell may be provided by a manufacturer in a semiconductor manufacturing process.

The cell may refer to a standard cell or a switch cell. A switch cell may be an element configured to generate a virtual voltage $VV_{DD}$ based on a power supply voltage $V_{DD}$ supplied from the outside. In addition, a standard cell may be any one of various cells for implementing a logic circuit. For example, the standard cell may indicate any one of various logic gates such as an AND gate, an OR gate, a NOR gate, an XOR gate, and a NOT gate.

Referring to FIG. 1, a semiconductor device 100 may include metal-oxide-semiconductor (MOS)-based switch cells (SW cell). The semiconductor device 100 may further include standard cells interposed between switch cells.

The switch cells may be placed along a first direction D1. The switch cells may be placed to overlap a first global metal line GML1 in a top view or a plan view. In contrast to the first global metal line GML1, a switch cell does not overlap a second global metal line GML2 in the top view. As illustrated, the first global metal line GML1 and the second global metal line GML2 are placed in the uppermost layer of the layout, but example embodiments are not limited thereto. For example, the first global metal line GML1 and the second global metal line GML2 may be placed at the same level from a substrate.

A switch cell may be placed at a row different from a row of a switch cell adjacent in a row direction. The first global metal line GML1 may be divided into a first row Row1 and a second row Row2, and a boundary between the divided rows is a virtual boundary that is a criterion of placing switch cells. For example, the row direction may mean direction "D1". For example, a switch cell to be placed at a first column Col1 may be placed at the first row Row1 of the first global metal line GML1. A switch cell to be placed at a second column Col2 may be placed at the second row Row2 of the first global metal line GML1. A switch cell to be placed at a third column Col3 may be placed at the first row Row1 of the first global metal line GML1.

The switch cells may be placed along a second direction D2. In an example embodiment, as illustrated in FIG. 1, 9 switch cells are placed along three columns Col1, Col2, and Col3.

A first metal line ML11 and a second metal line ML12 may be placed along the second direction D2. For example, a pair of the first metal line ML11 and the second metal line ML12 placed at one column may overlap a switch cell in the top view. A power supply voltage $V_{DD}$ may be supplied to a switch cell through the first metal line ML11, and a virtual voltage $VV_{DD}$ may be output from a switch cell through the second metal line ML12. A via that connects the first metal line ML11 and a switch cell and is formed in a third direction D3 and a via that connects the second metal line ML12 and a switch cell and is formed in the third direction D3 may be provided.

A third metal line ML13 may be placed along the second direction D2. For example, the third metal line ML13 may be placed between adjacent second metal lines ML12. Further, as illustrated, a distance "d1" between a third metal line ML13 and second metal line ML12 may be substantially identical to a distance "d2" between the second metal line ML12 and a different metal line ML13. A ground voltage $V_{SS}$ may be supplied through the third metal line ML13. The ground voltage $V_{SS}$ may be supplied to a switch cell and/or a standard cell through one or more interconnections and/or one or more vias. For example, the first, second, and third metal lines ML11, ML12, and ML13 may be formed at the same level, however example embodiments are not limited thereto.

The first global metal line GML1 and the second global metal line GML2 may be formed on, or over, a layer where the first, second, and third metal lines ML11, ML12, and ML13 are formed. The first global metal line GML1 and the second global metal line GML2 may extend in the second direction D2 and may be alternately placed along the second direction D2. A width of the first global metal line GML1 in the second direction D2 may be the same as or different from a width of the second global metal line GML2 in the second direction D2. The power supply voltage $V_{DD}$ may be supplied through the first global metal line GML1, and the ground voltage $V_{SS}$ may be supplied through the second global metal line GML2.

The first global metal line GML1 and the first metal line ML11 may be connected through a first stack via V21. The second global metal line GML2 and the third metal line ML13 may be connected through a second stack via V22. Each first stack via V21 and second stack via V22 may include at least one via passing through at least one interconnection layer.

According to the placement and connections of metal lines and vias as described above, the power supply voltage $V_{DD}$ applied to the first global metal line GML1 is transferred to the first metal line ML11 through the first stack via V21. The power supply voltage $V_{DD}$ applied to the first metal line ML11 is applied to a switch cell through a via, and the switch cell thereby generates the virtual voltage $VV_{DD}$. The virtual voltage $VV_{DD}$ may be provided to a standard cell placed at the same row as a switch cell. Alternatively or additionally, the virtual voltage $VV_{DD}$ may be transferred to the second metal line ML12 through a via so as to be provided to a standard cell placed in a region overlapping the second global metal line GML2 in the top view.

According to the above-described placement/configuration, a distance of one or more interconnections through which the power supply voltage $V_{DD}$ is transferred and one or more interconnections through which the ground voltage $V_{SS}$ is transferred may be minimized, and interconnections may be simplified. In addition, because two switch cells adjacent in the first direction D1 are placed at different rows, the virtual voltage $VV_{DD}$ may be effectively supplied to a region that is not covered by each switch cell.

Figure 2:
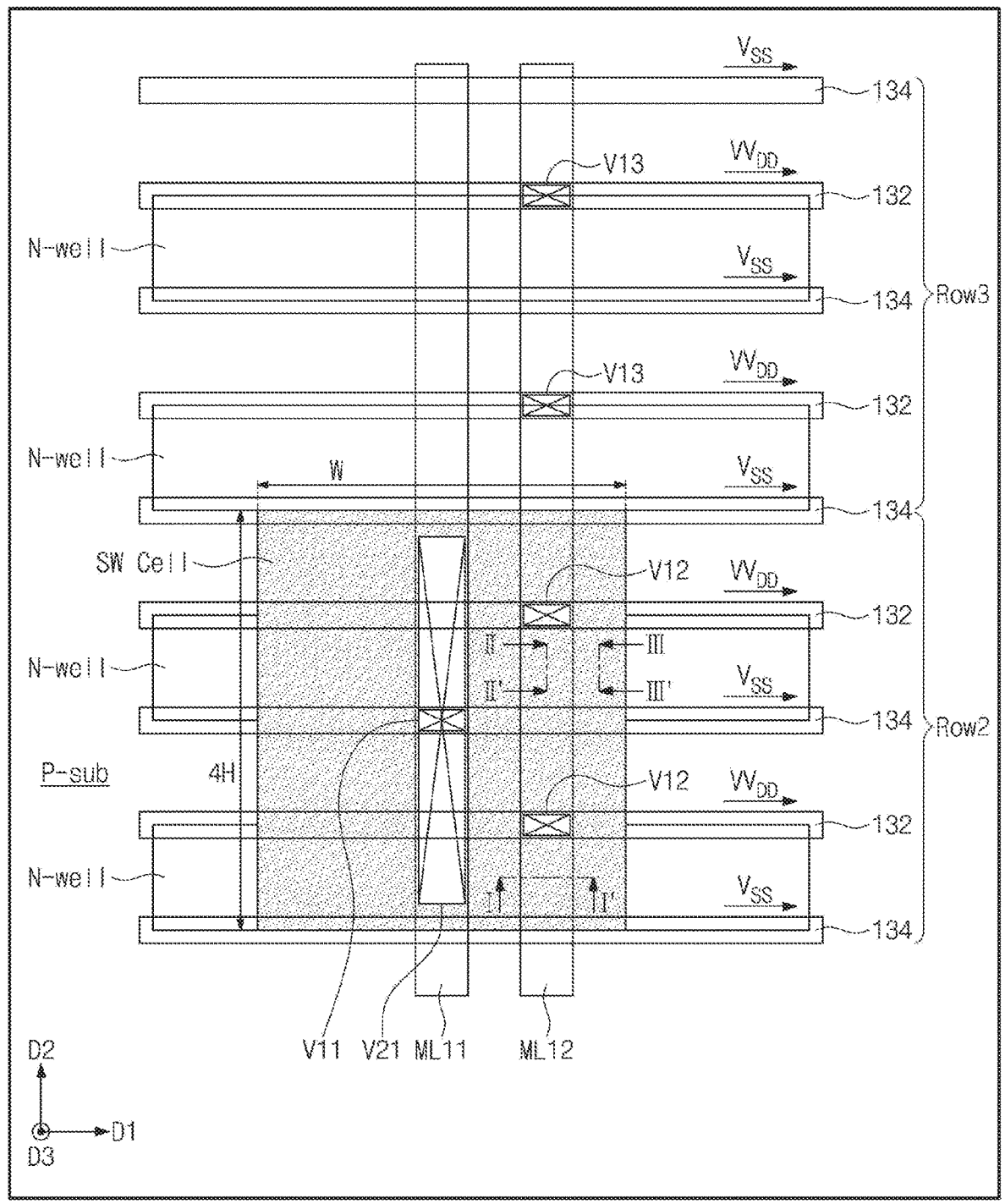
FIG. 2 is a layout illustrating a portion "A" of a semiconductor device illustrated in FIG. 1.

FIG. 2 is a layout illustrating a portion "A" of a semiconductor device illustrated in FIG. 1.

The semiconductor device 100 may include a substrate P-sub, a switch cell SW cell, a virtual voltage line 132, a ground line 134, a first metal line ML11, and a second metal line ML12.

The substrate P-sub may be doped with a P-type dopant. N-wells may be formed in the substrate P-sub. An N-well may be a region of the substrate P-sub, which is doped with an N-type dopant. The N-wells may extend in the first direction D1 and may be formed in/on the substrate P-sub along the second direction D2. For example, a width of an N-well or a width between two adjacent N-wells may be defined as "1H" (H indicating a height). In this case, the width of the N-well may be identical to or different from the width between two adjacent N-wells. For example, in the case where an inverter is formed by forming a P-channel metal-oxide-semiconductor (PMOS) transistor and an N-channel metal-oxide-semiconductor (NMOS) transistor in the N-well and the substrate P-sub, respectively, the inverter may be a standard cell having 2H.

The switch cell SW Cell may be formed on the substrate P-sub. The switch cell SW Cell may be implemented with, but is not limited to, one or more transistors, such as a metal oxide semiconductor field transistor (MOSFET), a fin field effect transistor (FinFET), or the like. For example, the switch cell SW Cell may be a switch cell based on a PMOS transistor. However, in another example embodiment, the switch cell SW Cell may be a switch cell based on an NMOS transistor formed in the substrate P-sub.

The switch cell SW Cell may be a multi-height cell formed in a plurality of N-wells. In an example embodiment, the switch cell SW Cell is illustrated in FIG. 2 as having a height of 4H and a width of "W", but example embodiments are not limited thereto. Also, the switch cell SW Cell is illustrated as being formed at a second row Row2. As illustrated in FIG. 1, another switch cell adjacent to the switch cell SW Cell in the first direction D1 may be formed at a first row Row1. In other words, a switch cell SW Cell formed at the first row Row1 does not share an N-well with an adjacent switch cell SW Cell.

The virtual voltage lines 132 and the ground lines 134 may be alternately formed along the second direction D2. The virtual voltage line 132 and the ground line 134 may extend in the first direction D1. Each of the virtual voltage line 132 and the ground line 134 may be formed on the boundary of an N-well and the substrate P-sub. For example, the virtual voltage line 132 and the ground line 134 may be formed on the switch cell SW Cell. The virtual voltage line 132 and the ground line 134 may be formed at the same level (or layer) from the substrate P-sub, but example embodiments are not limited thereto.

The virtual voltage line 132 may provide adjacent standard cells with the virtual voltage $VV_{DD}$ supplied from the switch cell SW Cell. The ground line 134 may provide adjacent standard cells with the ground voltage $V_{SS}$ supplied from the outside.

A first via V11 may be formed on the switch cell SW Cell. The first via V11 may electrically connect the first metal line ML11 and the switch cell SW Cell. In detail, the first via V11 may be a path through which the power supply voltage $V_{DD}$ supplied from the first metal line ML11 is transferred to the switch cell SW Cell. As an example, it is illustrated in FIG. 2 as the one first via V11 is formed, but example embodiments are not limited thereto.

A second via V12 may be formed on the switch cell SW Cell. The second via V12 may electrically connect the second metal line ML12 and the switch cell SW Cell. In detail, the second via V12 may be a path through which the virtual voltage $VV_{DD}$ generated by the switch cell SW Cell is transferred to the second metal line ML12. An example is illustrated in FIG. 2 as the two second vias V12 are formed, but the number of vias is not limited thereto. For example, if the switch cell SW Cell is a switch cell having 6H, three second vias V12 may be provided.

A third via V13 may be formed on the virtual voltage line 132 formed at a third row Row3. The third via V13 may electrically connect the second metal line ML12 with the virtual voltage line 132 formed at the third row Row3. In detail, the third via V13 may be a path through which the virtual voltage $VV_{DD}$ generated by the switch cell SW Cell is transferred to the virtual voltage line 132 of the third row Row3 through the second via V12 and the second metal line ML12.

A first stack via V21 may be formed on the first metal line ML11. For example, the first stack via V21 may be implemented with one via passing through one layer. Alternatively, the first stack via V21 may be implemented with two or more vias passing through two or more layers. The first stack via V21 may electrically connect the first metal line ML11 and the first global metal line GML1 (refer to FIG. 1). In detail, the first stack via V21 may be a path through which the power supply voltage $V_{DD}$ supplied from the outside through the first global metal line GML1 is transferred to the first metal line ML11.

The first global metal line GML1 may be formed on the first stack via V21. For example, as illustrated in FIG. 1, the first global metal line GML1 may overlap the first row Row1 and the second row Row2. That is, the first global metal line GML1 may extend in the first direction D1. The power supply voltage $V_{DD}$ may be applied through the first global metal line GML1.

Figure 3:
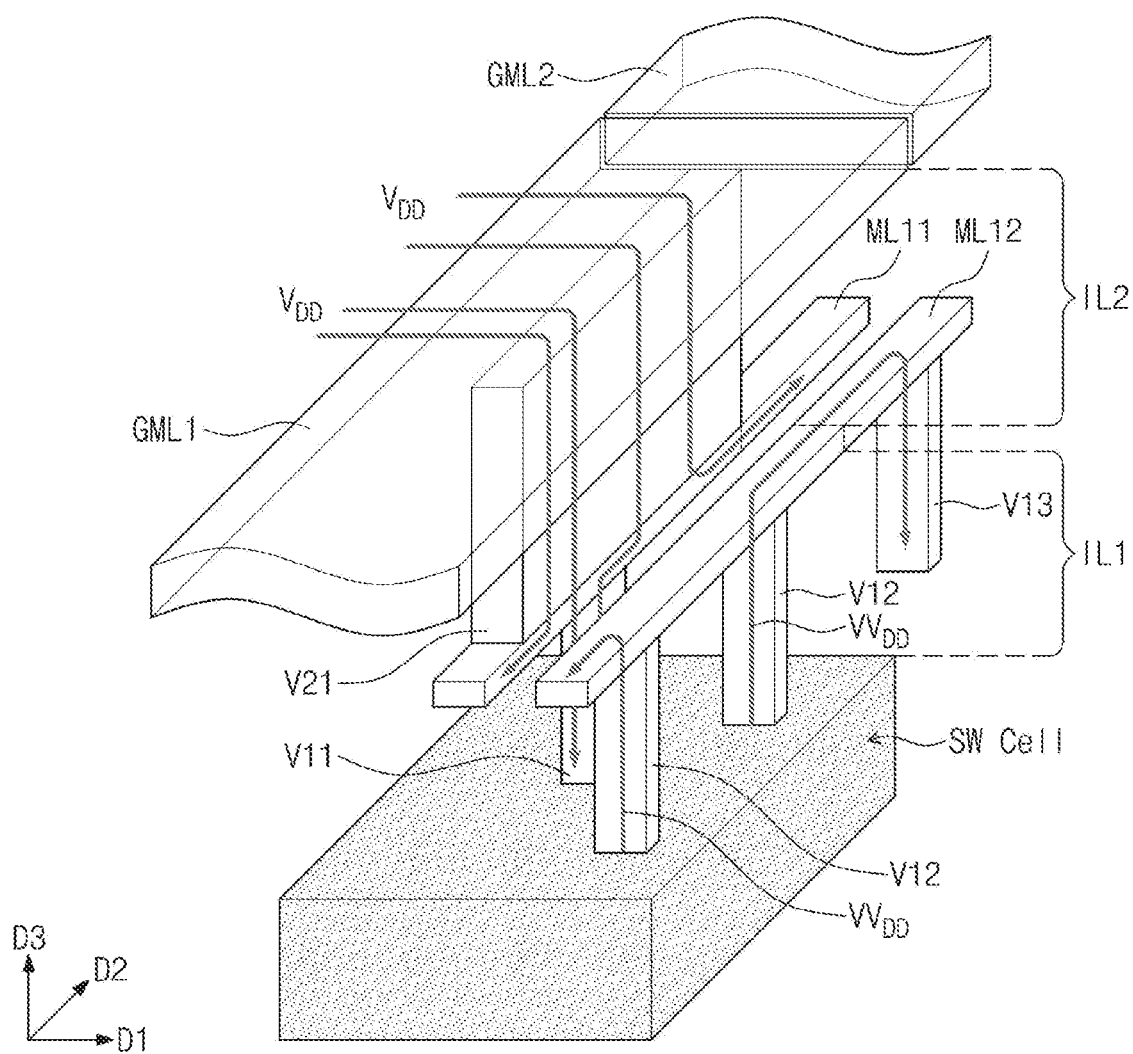
FIG. 3 is a three-dimensional view illustrating interconnections in the vicinity of a first stack via of a semiconductor device according to an example embodiment.

FIG. 3 is a three-dimensional view illustrating interconnections in the vicinity of the first stack via V21 of a semiconductor device according to an example embodiment, and a description will be given with reference to FIGS. 1 and 2.

The first via V11 and the second via V12 that pass through a first intermediate layer IL1 may be formed on the switch cell SW Cell. In addition, the third via V13 for supplying the virtual voltage $VV_{DD}$ to a standard cell placed at a row different from a row of the switch cell SW Cell may be formed. The first intermediate layer IL1 may include one or more interconnection layers. For example, each interconnection layer may include one or more metal interconnections. That is, the first via V11, the second via V12, and the third via V13 may pass through one or more interconnection layers of the first intermediate layer IL1.

The first stack via V21 that passes through a second intermediate layer IL2 may be formed on the first metal line ML11. The second intermediate layer IL2 may include one or more interconnection layers.

The switch cell SW Cell may overlap the first global metal line GML1 in the top view but may not overlap the second global metal line GML2. The first metal line ML11 and the second metal line ML12 are placed to cross the switch cell SW Cell in the second direction D2 in the top view. Therefore, the first via V11 connecting the switch cell SW Cell and the first metal line ML11 and the second via V12 connecting the switch cell SW Cell and the second metal line ML12 overlap the switch cell SW Cell in the top view. In addition, the first stack via V21 connecting the first global metal line GML1 and the first metal line ML11 overlaps the switch cell SW Cell in the top view.

According to the above placement, because a path for supplying the power supply voltage $V_{DD}$ and a path for supplying the virtual voltage $VV_{DD}$ are simplified, the effectiveness of routing may be improved, and complexity may decrease.

Figure 4:
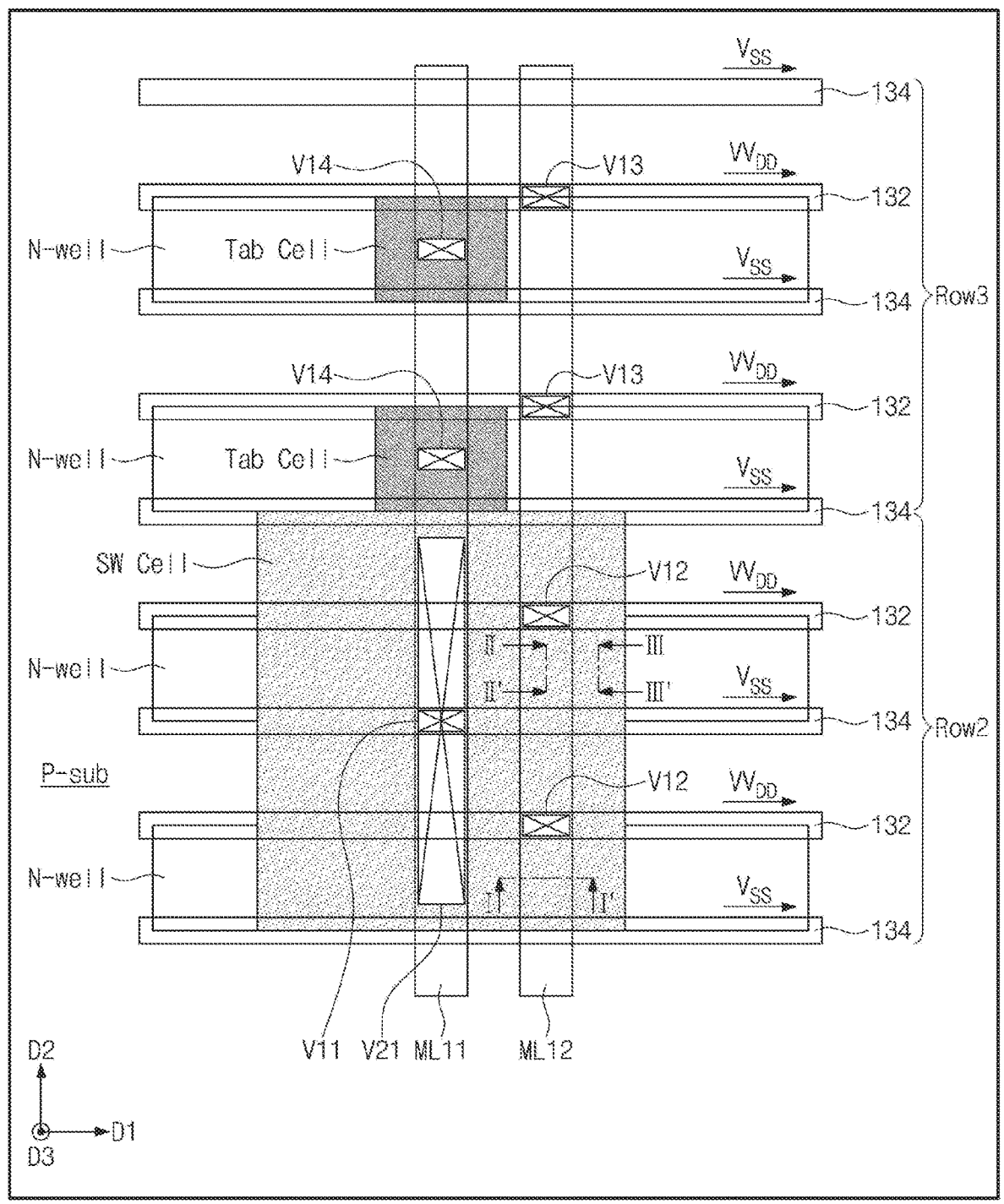
FIG. 4 is a layout illustrating a portion "A" of a semiconductor device illustrated in FIG. 1.

FIG. 4 is a layout illustrating a portion "A" of a semiconductor device illustrated in FIG. 1. An example embodiment illustrated in FIG. 4 is similar to the example embodiment described with reference to FIGS. 2 and 3. Below, a difference will be mainly described with reference to FIGS. 1 and 4.

A semiconductor device may include the substrate P-sub, the N-wells the switch cell SW cell, the virtual voltage line 132, the ground line 134, the first metal line ML11, and the second metal line ML12. In addition, the semiconductor device may further include a tap cell, and a fourth via V14 connecting the first metal line ML11 and the tap cell.

The tap cell may be formed on the N-well adjacent to the switch cell SW Cell. The tap cell may correspond to a region doped with an N-type dopant. For example, a doping concentration of the tap cell may be different from a doping concentration of the N-well. The tap cell may prevent a latch-up phenomenon occurring in the semiconductor device.

In the example embodiment of FIG. 4, the tap cell is illustrated as being formed in the N-well adjacent to the switch cell SW Cell along the second direction D2. However, in other example embodiments, the placement of the tap cell may be variously changed or modified. For example, one or more tap cells may be formed in one or more N-wells adjacent to the switch cell SW Cell along the first direction D1.

Figure 5:
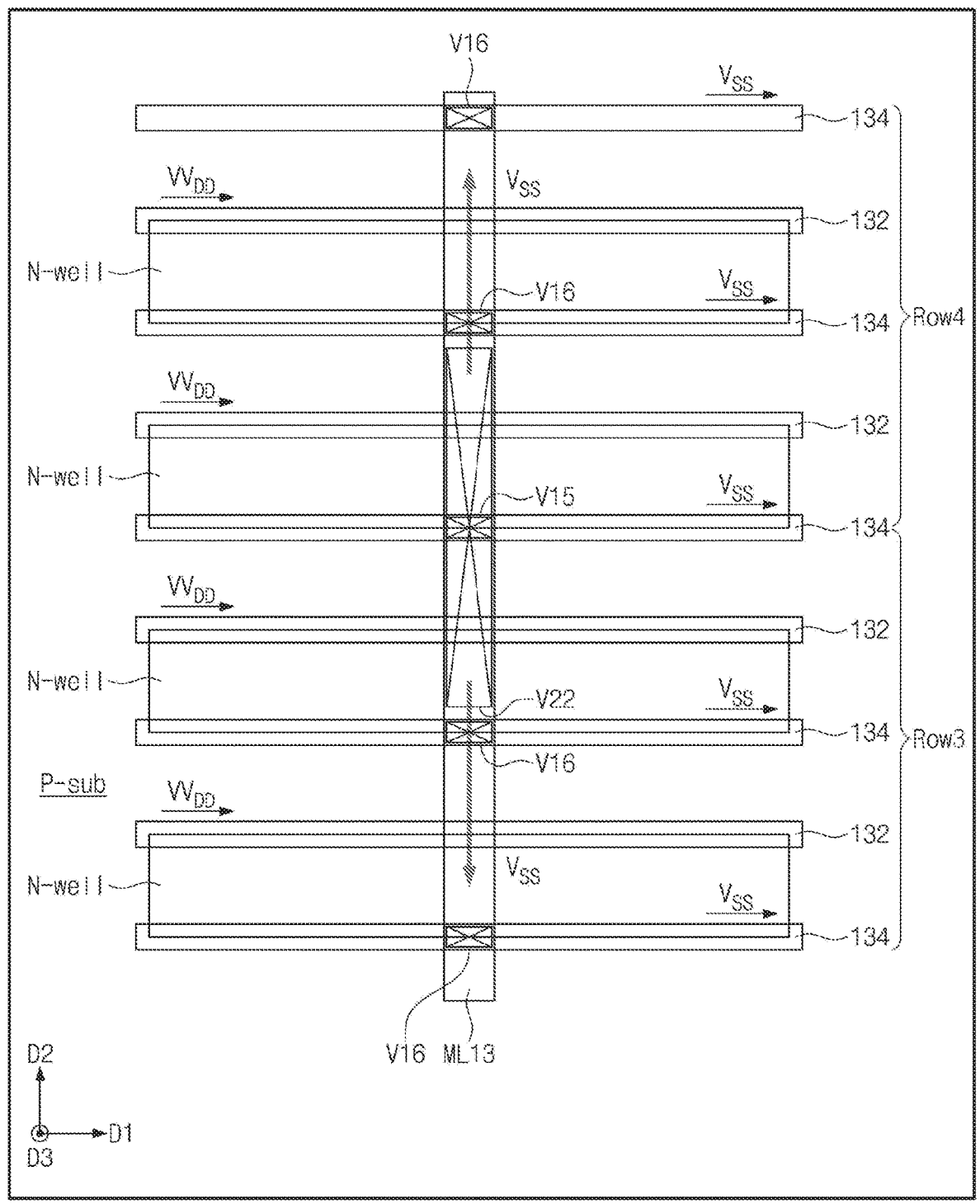
FIG. 5 is a layout illustrating a portion "B" of a semiconductor device illustrated in FIG. 1.

FIG. 5 is a layout illustrating a portion "B" of a semiconductor device illustrated in FIG. 1, and a description will be given with reference to FIGS. 1 and 5.

The semiconductor device 100 may further include a third metal line ML13 in addition to components (e.g., a substrate, an N-well, a switch cell, a virtual voltage line, a ground line, a first metal line, and a second metal line) described with reference to FIG. 2.

The ground line 134 may be formed on the substrate P-sub. However, the ground line 134 may not be in contact with the substrate P-sub and may be formed on a standard cell formed on the substrate P-sub. For example, the ground line 134 may extend in the first direction D1 and may be formed at a portion of the substrate P-sub which is in contact with the N-well.

A fifth via V15 and a sixth via V16 may be formed on the third metal line ML13. The fifth via V15 and the sixth via V16 may pass through one or more interconnection layers formed on the ground line 134. As illustrated in FIG. 5, the fifth via V15 may overlap a second stack via V22 in the top view, and the sixth via V16 may not overlap the second stack via V22 in the top view.

The third metal line ML13 may be formed on the ground line 134 along the second direction D2. For example, the third metal line ML13 may be formed at the same level as the first metal line ML11 and the second metal line ML12 illustrated in FIG. 2. That is, a height from the substrate P-sub to the third metal line ML13 may be the same as heights from the substrate P-sub to the first metal line ML11 and the second metal line ML12. However, example embodiments are not limited thereto.

The second stack via V22 may be formed on the third metal line ML13. The second stack via V22 may pass through one or more interconnection layers formed on the third metal line ML13.

The second global metal line GML2 may be formed on the second stack via V22. For example, as illustrated in FIG. 1, the second global metal line GML2 may extend in the first direction D1 and may not overlap the rows Row1 and Row2 at which the switch cell SW Cell is placed.

Figure 6:
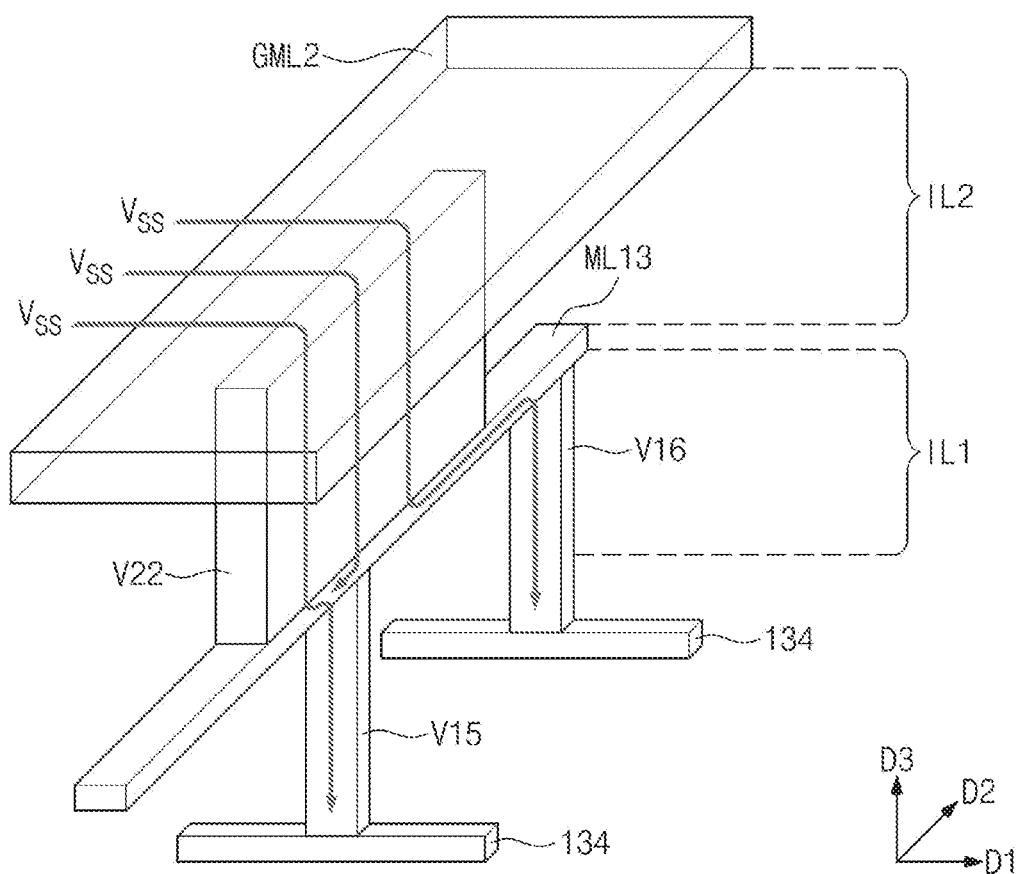
FIG. 6 is a three-dimensional view illustrating interconnections in the vicinity of a second stack via of a semiconductor device according to an example embodiment.

FIG. 6 is a three-dimensional view illustrating interconnections in the vicinity of the second stack via V22 of a semiconductor device according to an example embodiment, and a description will be given with reference to FIGS. 1 and 6 together.

The fifth via V15 and the sixth via V16 that pass through the first intermediate layer IL1 may be formed on the ground lines 134. The first intermediate layer IL1 may include one or more interconnection layers, and each interconnection layer may include one or more metal interconnections. That is, the fifth via V15 and the sixth via V16 may pass through one or more interconnection layers of the first intermediate layer IL1.

The second stack via V22 that passes through a second intermediate layer IL2 may be formed on the third metal line ML13. The second intermediate layer IL2 may include one or more interconnection layers. That is, the second stack via V22 may pass through one or more interconnection layers of the second intermediate layer IL2.

The second stack via V22 may overlap the second global metal line GML2 in the top view but may not overlap the first global metal line GML1. According to the above placement, because a path for supplying the ground voltage $V_{SS}$ is simplified, the effectiveness of routing may be improved, and complexity may decrease.

Figure 7:
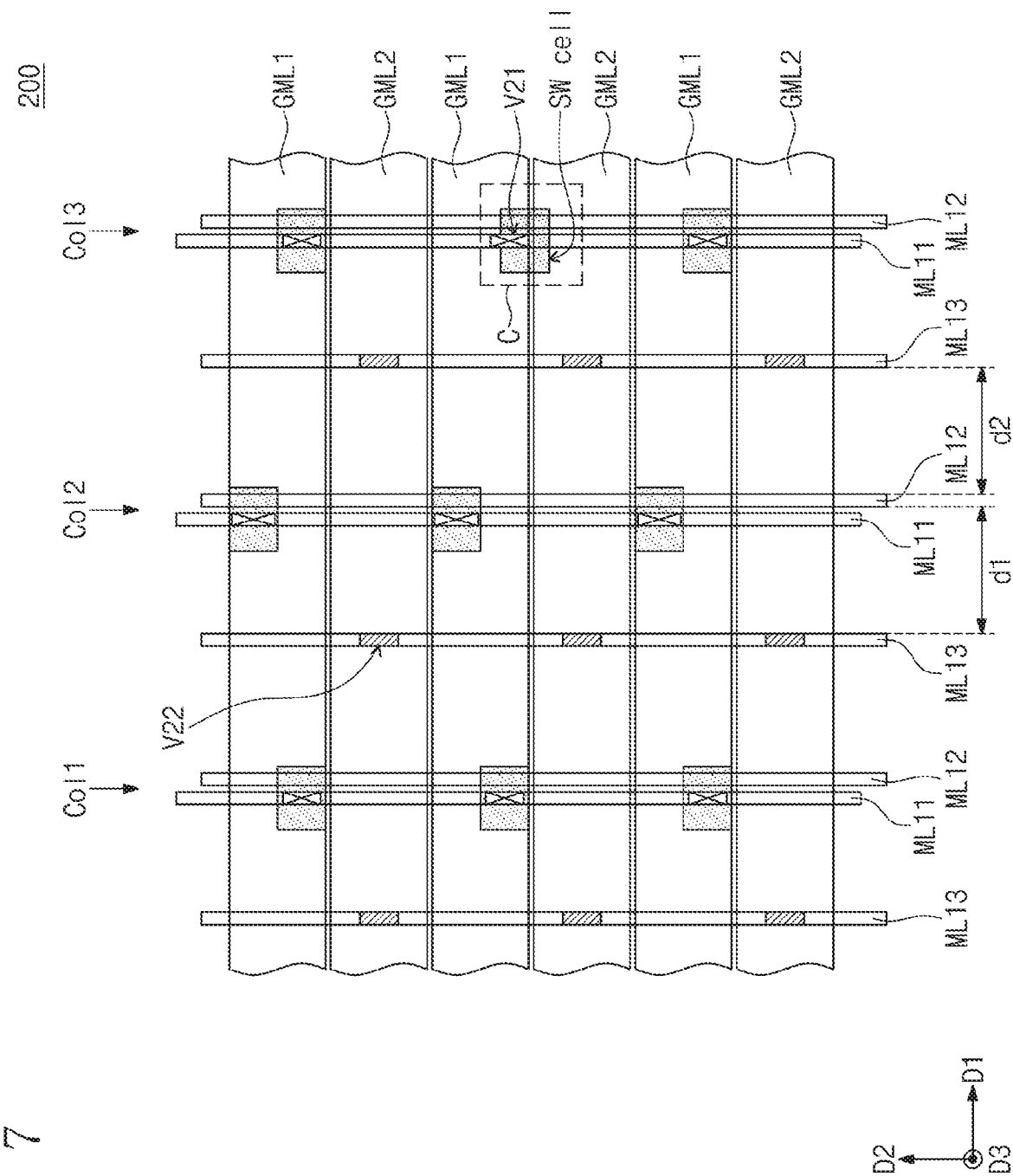
FIG. 7 is a view illustrating a layout of a semiconductor device including switch cells according to an example embodiment.

FIG. 7 is a view illustrating a layout of a semiconductor device 200 including a switch cell according to an example embodiment. In contrast to the example embodiments described with reference to FIGS. 1 to 6, at least a part of switch cells may overlap the second global metal line GML2 as well as the first global metal line GML1, in the top view. Below, the difference will be mainly described.

Referring to a dotted box marked by "C", a switch cell overlaps the first global metal line GML1 on the whole in the top view. In addition, a part of the switch cell overlaps the second global metal line GML2 in the top view.

Further, the first stack via V21 overlaps the first global metal line GML1 and does not overlap the second global metal line GML2. This is to simplify a path where the power supply voltage $V_{DD}$ is transferred to a switch cell through the first global metal line GML1, the first stack via V21, a first metal line (e.g., ML11 of FIG. 3), and a first via (e.g., V11 of FIG. 3).

As in the case where the first stack via V21 overlaps the first global metal line GML1 in the top view, the second stack via V22 overlaps the second global metal line GML2 in the top view. This is to simplify a path where the ground voltage $V_{SS}$ is transferred to a standard cell through the second global metal line GML2, the second stack via V22, and a fifth via (e.g., V15 of FIG. 6).

Figure 8:
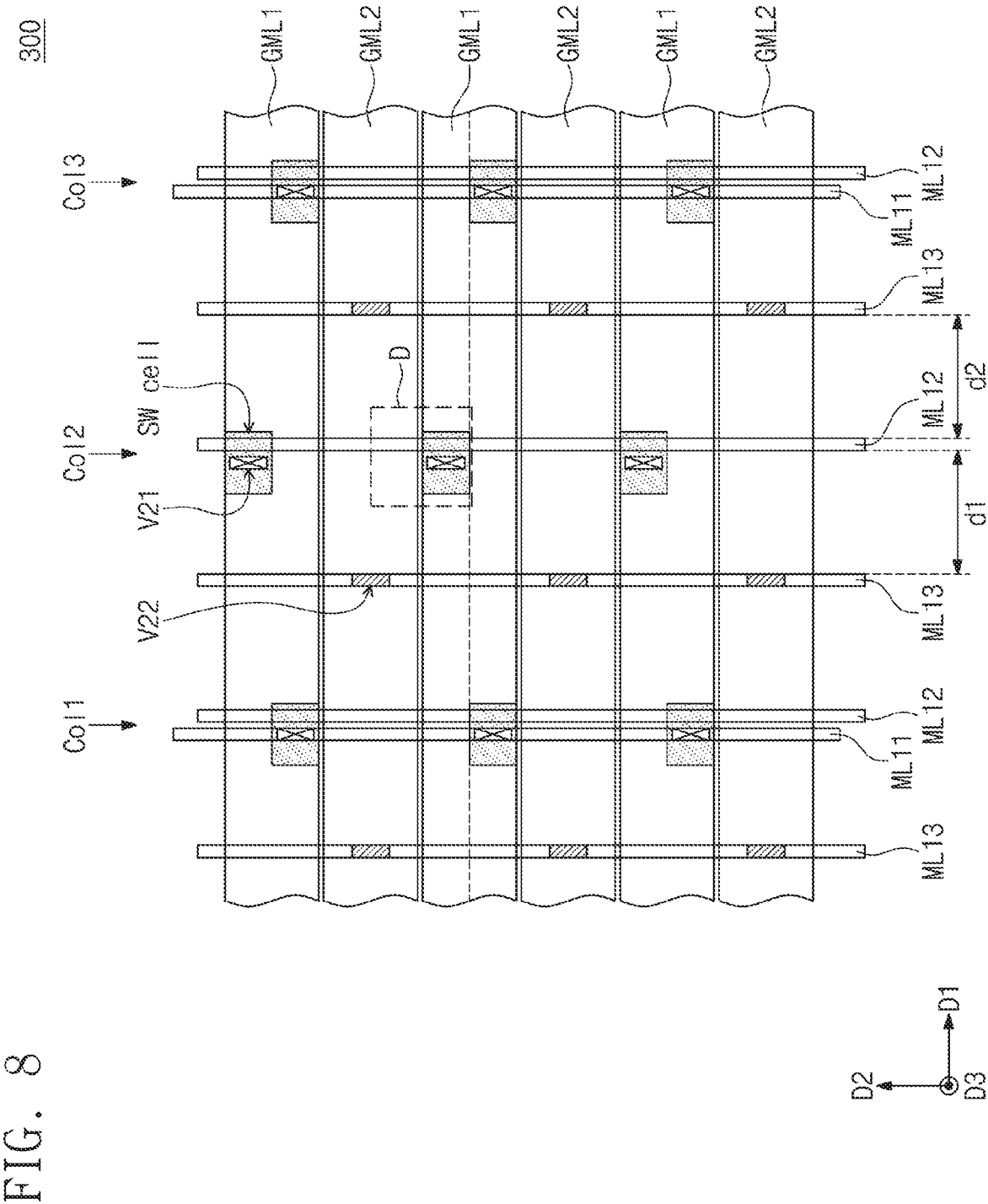
FIG. 8 is a view illustrating a layout of a semiconductor device including switch cells according to an example embodiment.

FIG. 8 is a view illustrating a layout of a semiconductor device 300 including switch cells according to an example embodiment. The example embodiment of FIG. 8 is similar to the example embodiment of FIG. 1. However, the first metal line ML11 connecting switch cells in the second direction D2 is not provided at each of columns Col1, Col2, and Col3. In an example embodiment, the first metal line ML11 connecting switch cells in the second direction D2 may be provided at the first column Col1 and the third column Col3. In contrast, first metal lines provided at switch cells of the second column Col2 are not electrically connected to each other, which will be described with reference to FIG. 9.

Additionally, according to an example embodiment, tap cells (refer to FIG. 4) may be provided adjacent to switch cells of the first column Col1 and the third column Col3. However, a tap cell may not be provided at switch cells of the second column Col2.

Figure 9:
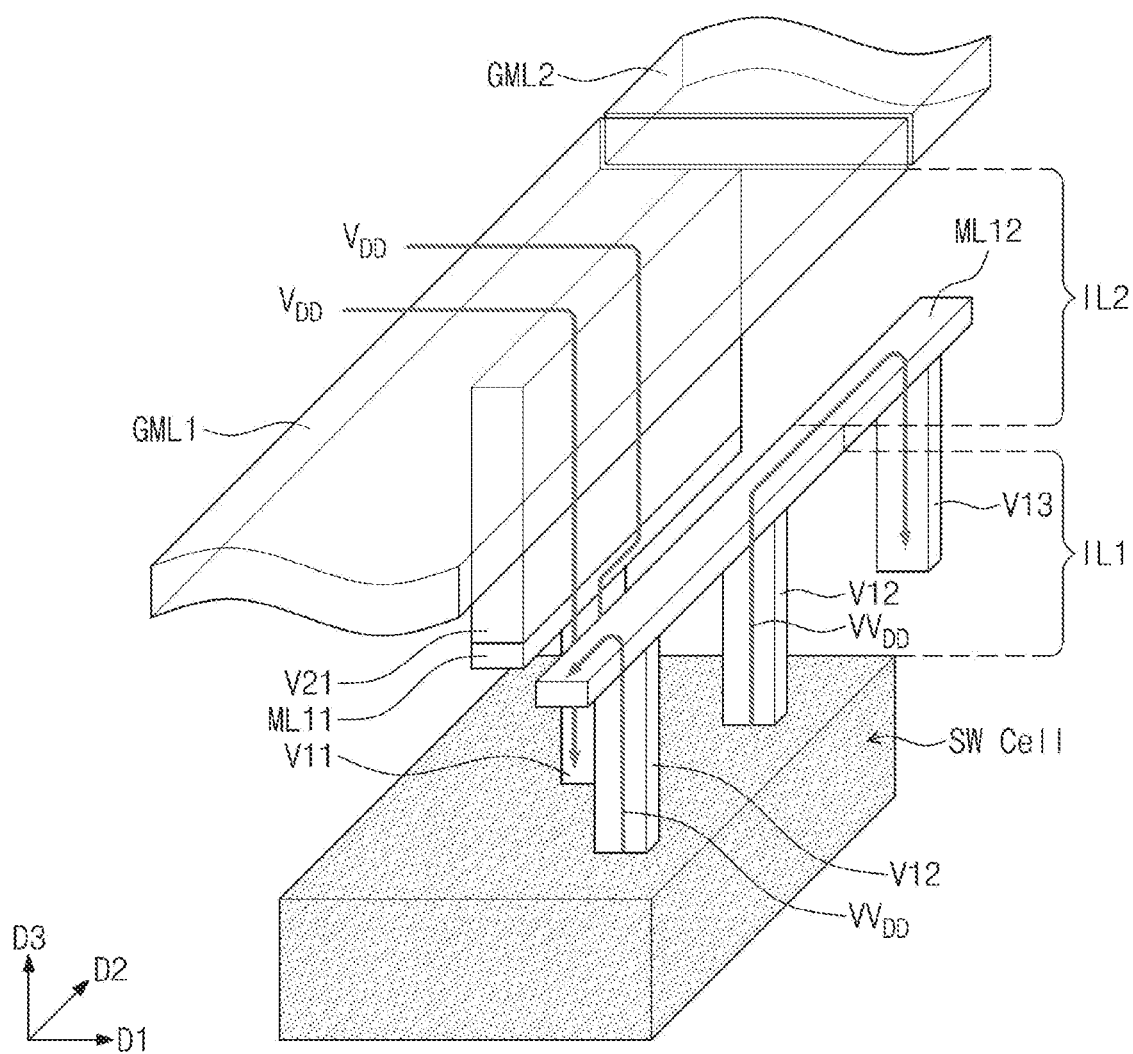
FIG. 9 is a layout illustrating a portion "D" of a semiconductor device illustrated in FIG. 8.

FIG. 9 is a layout illustrating a portion "D" of a semiconductor device illustrated in FIG. 8, and a description will be given with reference to FIGS. 8 and 9.

The first metal line ML11 is also provided on a switch cell included in a box "D" of FIG. 8. However, in contrast to the example embodiment of FIG. 3, a tap cell is not provided at switch cells of the second column Col2. Accordingly, there is no need to provide a first metal line (e.g., ML11 of FIG. 3) that provides the power supply voltage $V_{DD}$ to tap cells and connects switch cells in the second direction D2. Instead, the first metal lines ML1 that are separated such that switch cells of the second column Col2 are not connected to each other, are provided on respective switch cells. For example, the first metal line ML11 may overlap the first stack via V21 in the top view.

Figure 10:
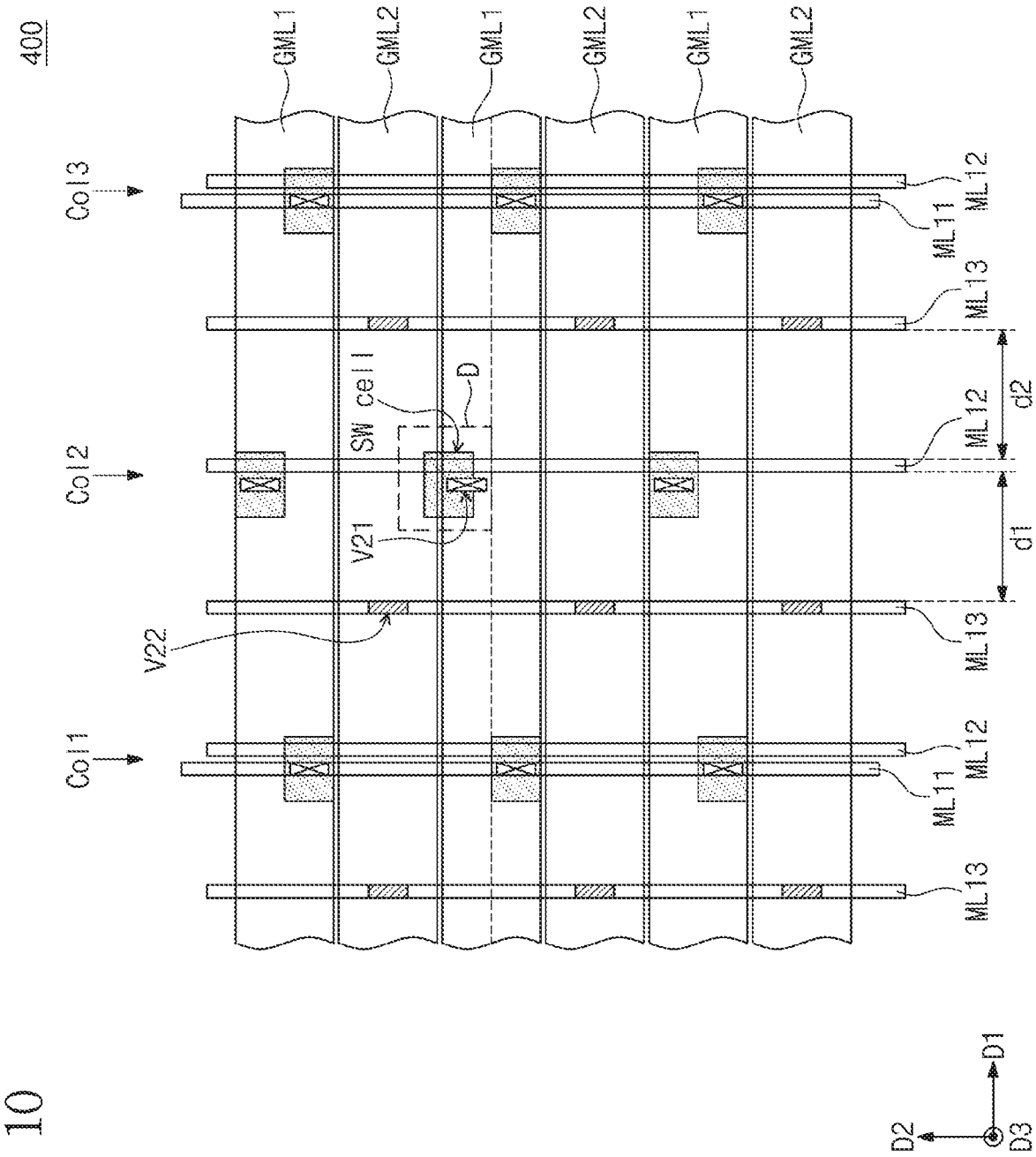
FIG. 10 is a view illustrating a layout of a semiconductor device including switch cells according to an example embodiment.

FIG. 10 is a view illustrating a layout of a semiconductor device 400 including switch cells according to an example embodiment. Because the example embodiment of FIG. 10 is similar to the example embodiment of FIG. 8, a difference will be mainly described.

As in the example embodiment described with reference to FIG. 7, at least a part of switch cells of the second column Col2 may at least partially overlap the second global metal line GML2 as well as the first global metal line GML1, in the top view. However, the first stack via V21 overlaps the first global metal line GML1 and does not overlap the second global metal line GML2.

Figure 11:
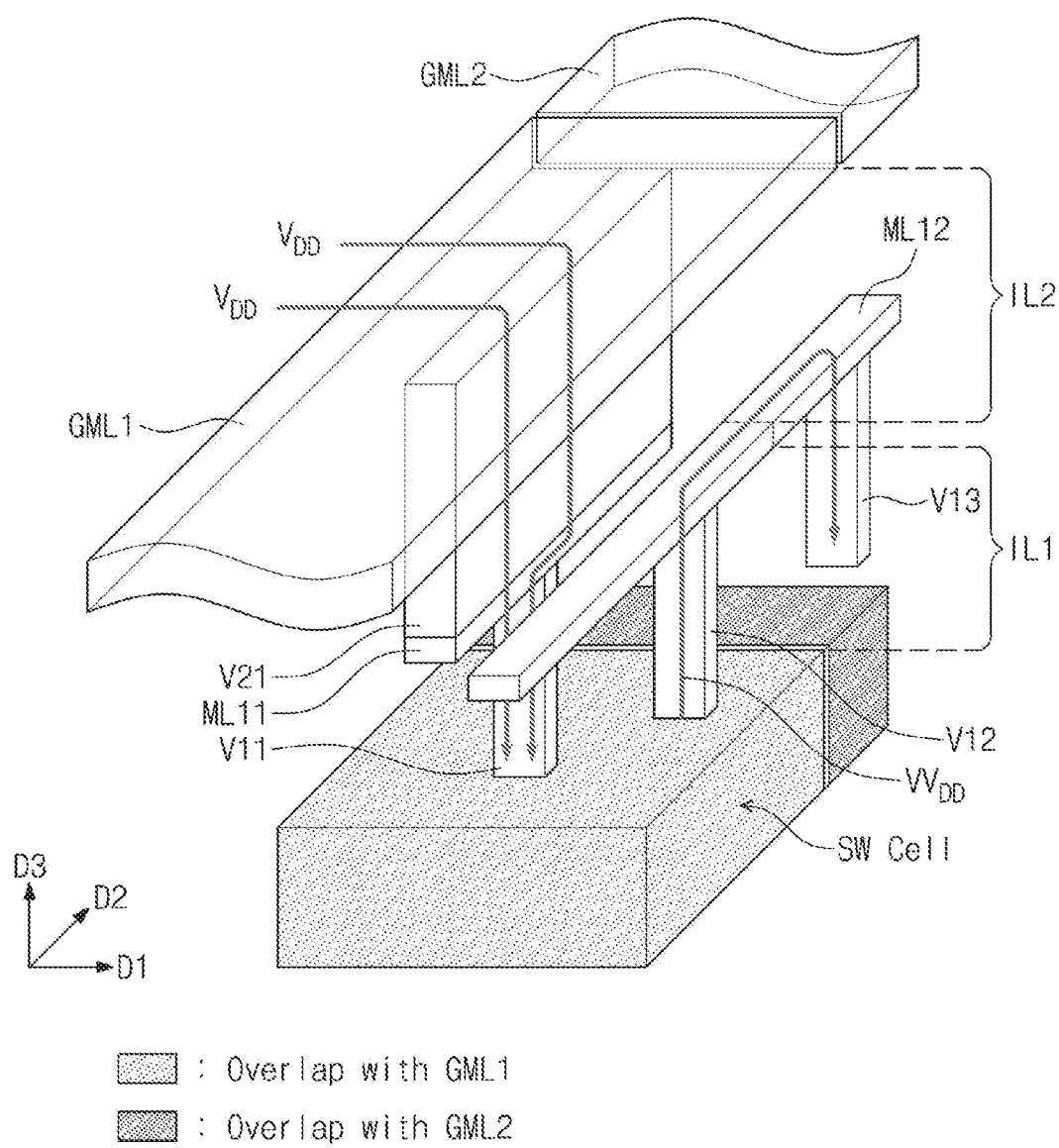
FIG. 11 is a three-dimensional view illustrating interconnections of a portion "D" of a semiconductor device illustrated in FIG. 10.

FIG. 11 is a three-dimensional view illustrating interconnection of a portion "D" of a semiconductor device illustrated in FIG. 10. An example embodiment illustrated in FIG. 11 is similar to the example embodiment described with reference to FIG. 9. However, a switch cell overlaps the second global metal line GML2 as well as the first global metal line GML1, in the top view. Portions where the switch cell overlaps the first global metal line GML1 or the second global metal line GML2 are differently shaded. In addition, in contrast to the example embodiment of FIG. 9, one second via V12 is formed on a switch cell, but example embodiments are not limited thereto.

Figure 12:
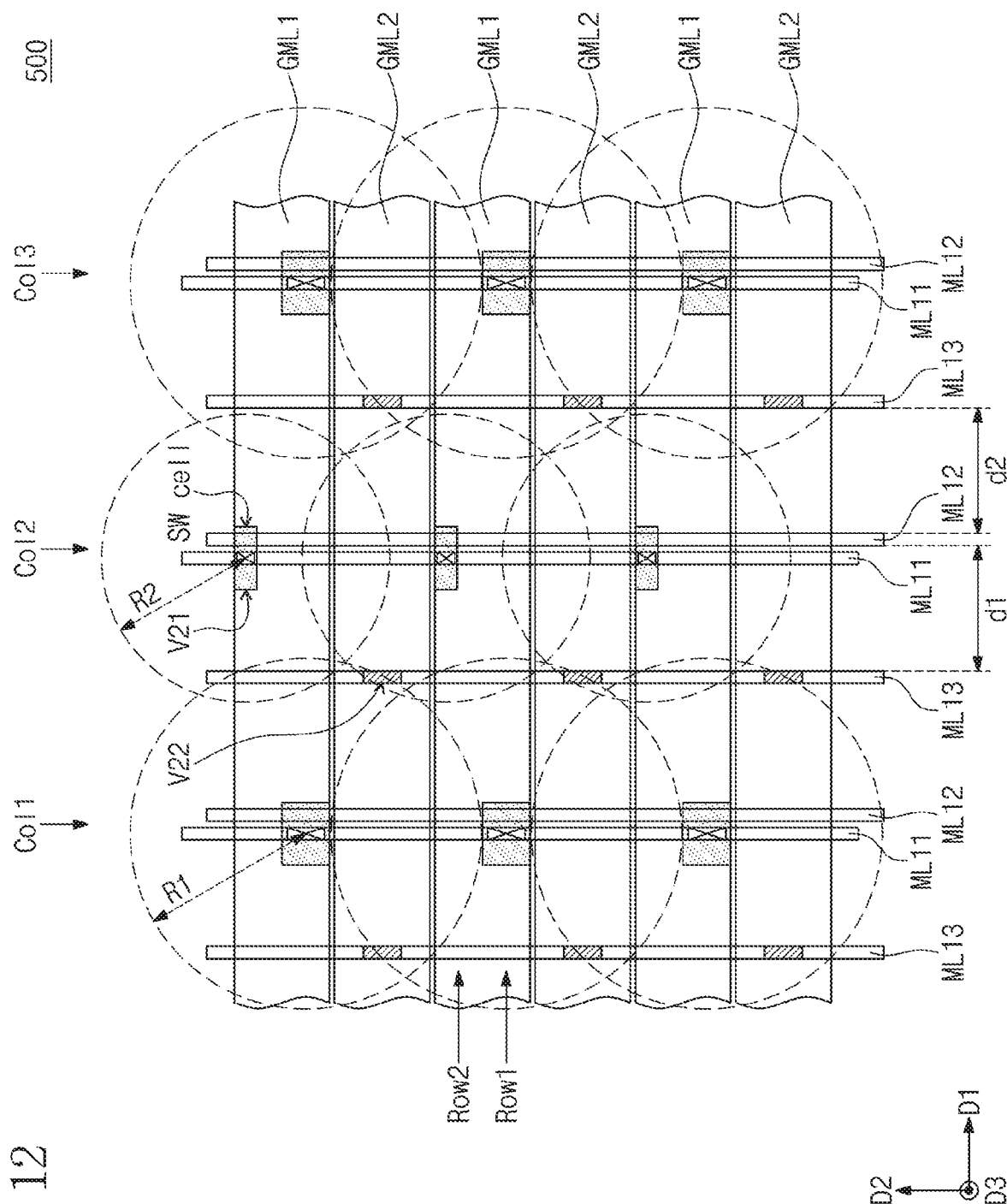
FIG. 12 is a view illustrating a layout of a semiconductor device including switch cells according to an example embodiment.

FIG. 12 is a view illustrating a layout of a semiconductor device 500 including switch cells according to an example embodiment. The example embodiment of FIG. 12 is similar to the example embodiment of FIG. 1. Below, a difference will be mainly described.

In the example embodiment described with reference to FIG. 1, all switch cells have the same size (e.g., 4H). However, in the example embodiment of FIG. 12, the sizes of switch cells may vary with locations where the switch cells placed. For example, as in the example embodiment described with reference to FIG. 1, switch cells placed at the first column Col1 and the third column Col3 may have the size of 4H. However, the size of switch cells placed at the second column Col2 may be different from the size of switch cells placed at the first column Col1 and the third column Col3. This may be associated with the area that may be covered by each switch cell (i.e., a range where the virtual voltage $VV_{DD}$ is smoothly provided by a switch cell).

Referring to FIG. 12, dotted circles indicate ranges covered by each switch cell. That is, a radius of a region covered by a switch cell that has the size of 4H and is placed at the first column Col1 and the third column Col3 is R1. However, if the size of a switch cell placed at the second column Col2 is set to be the same as the size of a switch cell placed at the first column Col1 or the third column Col3, a region where the virtual voltage $VV_{DD}$ is unnecessarily supplied may exist. Therefore, the size of the switch cell may be reduced to the extent that the switch cell does not have an influence on driving standard cells.

To show this conceptually, switch cells placed at the second column Col2 are illustrated to be smaller than the size of switch cells placed at other columns. Therefore, the radius "R2" of a region covered by a switch cell placed at the second column Col2 is illustrated as being smaller than the radius "R1".

An example is illustrated as the size of a switch cell placed at the second column Col2 is small. That is, the size of switch cells may be determined in consideration of various factors such as the number of transistors constituting a switch cell SW Cell and a distance between two adjacent switch cells.

Figure 13:
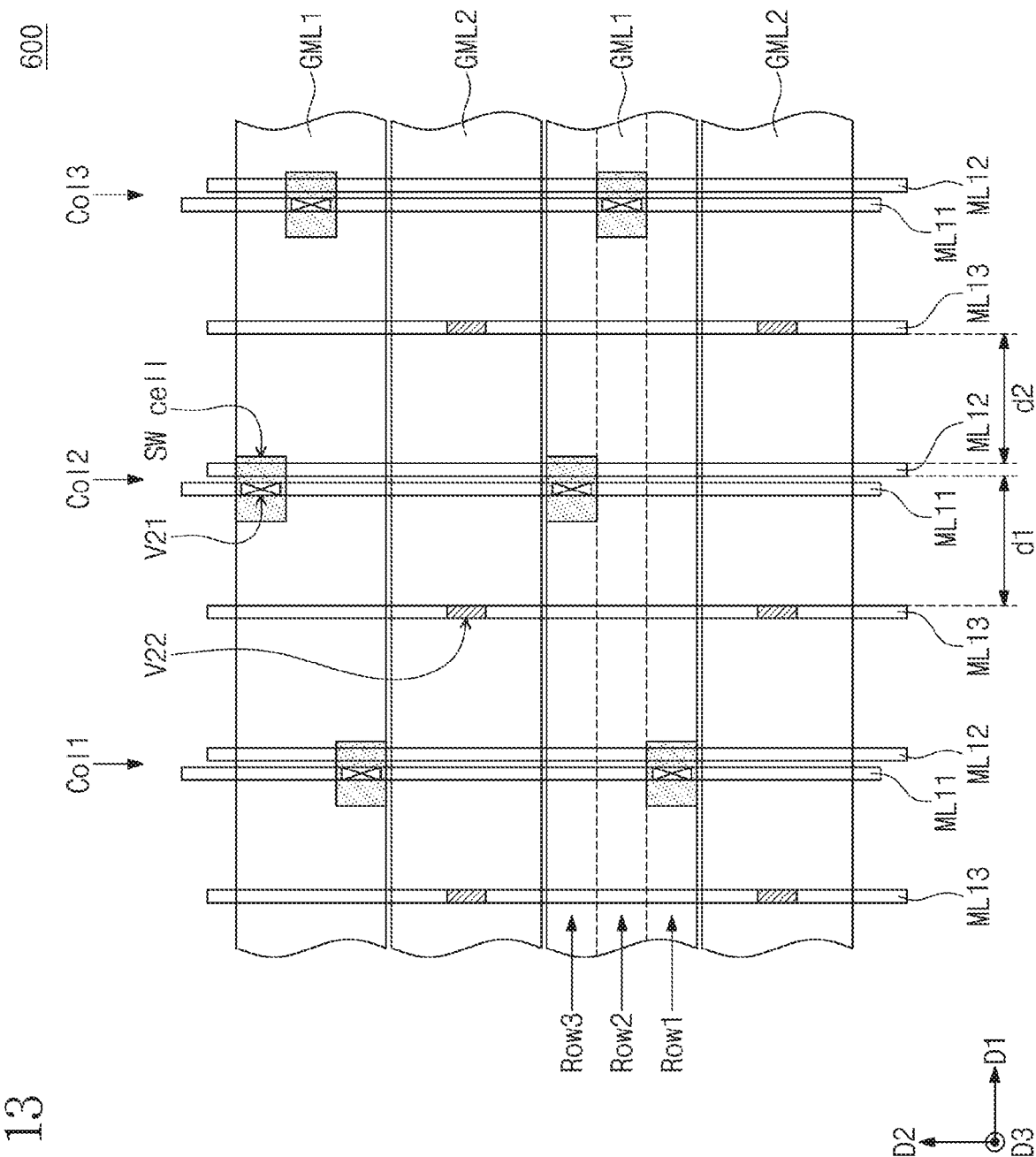
FIG. 13 is a view illustrating a layout of a semiconductor device including switch cells according to an example embodiment.

FIG. 13 is a view illustrating a layout of a semiconductor device 600 including switch cells according to an example embodiment. The example embodiment of FIG. 13 is similar to the above-described example embodiments. Below, a difference will be mainly described.

Referring to FIG. 13, in contrast to the above-described example embodiments, the first global metal line GML1 may be divided into three rows, and switch cells may be sequentially placed at different columns. The dotted lines indicating division of the first global metal line GML1 into three rows are virtual dotted lines.

First, each switch cell SW Cell to be placed at the first column Col1 may be formed on a substrate to overlap the first row Row1 of the first global metal line GML1. Each switch cell SW Cell to be placed at the second column Col2 may be formed on the substrate to overlap the third row Row3 of the first global metal line GML1. Each switch cell SW Cell to be placed at the third column Col3 may be formed on the substrate to overlap the second row Row2 of the first global metal line GML1. As a result, switch cells may be placed in a zigzag form along the first direction D1.

However, the above-described placement is an example, and example embodiments are not limited thereto. For example, in another example embodiment, each switch cell to be placed at the first column Col1 may be formed on the substrate to overlap the first row Row1 of the first global metal line GML1. Each switch cell SW Cell to be placed at the second column Col2 may be formed on the substrate to overlap the second row Row2 of the first global metal line GML1. Each switch cell SW Cell to be placed at the third column Col3 may be formed on the substrate to overlap the third row Row3 of the first global metal line GML1.

In FIG. 13, the first global metal line GML1 is illustrated as being divided into three virtual regions, but the number of virtual regions is not limited thereto. For example, the first global metal line GML1 may be divided into three or more virtual regions along the second direction D2.

Figure 14:
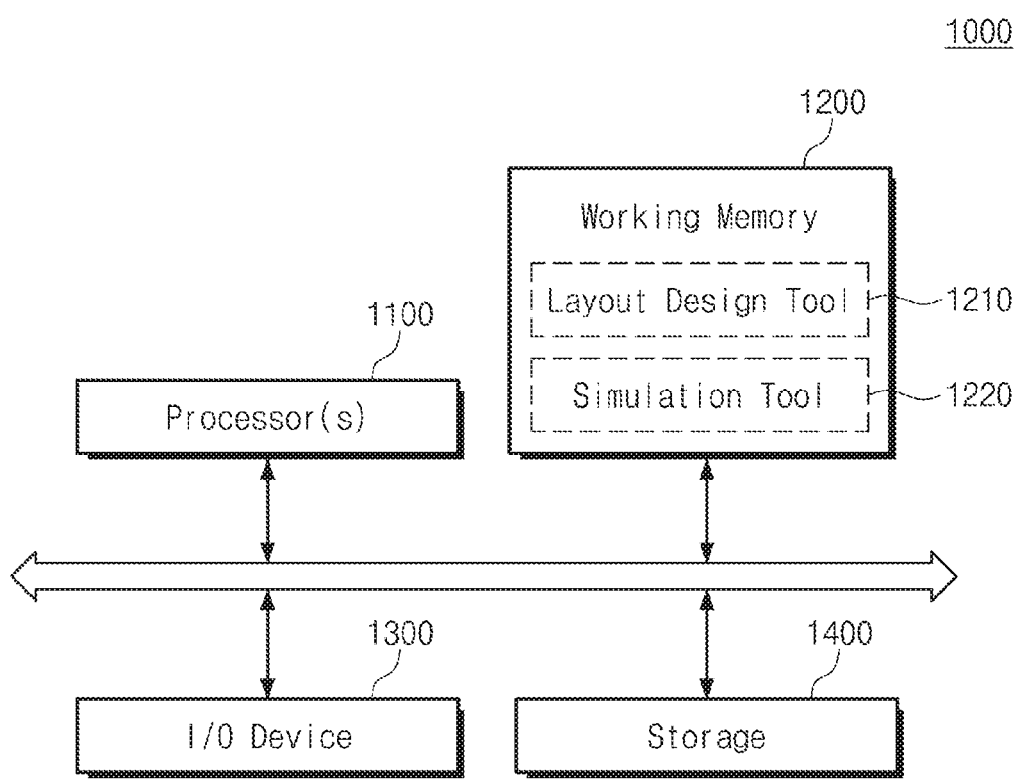
FIG. 14 is a block diagram illustrating a layout design system for designing a semiconductor device according to an example embodiment.

FIG. 14 is a block diagram illustrating a layout design system for designing a semiconductor device according to an example embodiment. Referring to FIG. 14, a layout design system 1000 may include at least one processor 1100, a working memory 1200, an input/output device 1300, and storage 1400. Here, the layout design system 1000 may be provided as a dedicated device for designing a layout of a semiconductor device according to an example embodiment. The layout design system 1000 may be configured to drive various design and verification simulation programs.

The processor 1100 may execute software (e.g., an application program, an operating system, a device driver) to be executed in the layout design system 1000. The processor 1100 may execute an operating system (OS) that is loaded to the working memory 1200. The processor 1100 may execute various application programs to be driven based on the OS. For example, the processor 1100 may execute a layout design tool 1210 that is loaded to the working memory 1200.

The OS or application programs may be loaded to the working memory 1200. Upon booting the layout design system 1000, an OS image stored in the storage 1400 may be loaded to the working memory 1200 depending on a booting sequence. Overall input/output operations of the layout design system 1000 may be supported by the OS. Likewise, application programs that are selected by a user or are used to provide a basic service may be loaded to the working memory 1200. In particular, the layout design tool 1210 for designing a layout according to an example embodiment may be loaded from the storage 1400 to the working memory 1200.

The layout design tool 1210 may include a biasing function of changing shapes and locations of specific layout patterns to be different from shapes and locations defined by a design rule. The layout design tool 1210 may perform design rule check (DRC) in the changed biasing data condition. The working memory 1200 may include a volatile memory such as a static random access memory (SRAM) or a dynamic random access memory (DRAM). However, example embodiments are not limited thereto.

A simulation tool 1220 that performs optical proximity correction (OPC) on designed layout data may be further loaded to the working memory 1200.

The input/output device 1300 may include various devices, which may be provided with information from a designer or may provide information to the designer, such as a keyboard, a mouse, and a monitor. For example, a processing procedure and a processed result of the simulation tool 1220 may be displayed through the input/output device 1300.

The storage 1400 is provided as a storage medium of the layout design system 1000. The storage 1400 may store the application programs, the OS image, and various kinds of data. For example, the storage 1400 may be implemented with a solid state drive (SSD), an embedded multimedia card (eMMC), or a hard disk drive (HDD). The storage 1400 may include, but is not limited to, a NAND Flash memory. For example, the storage 1400 may include a nonvolatile memory such as a phase change RAM (PRAM), a magnetic RAM (MRAM), a resistive RAM (ReRAM), or a ferroelectric RAM (FRAM).

Figure 15:
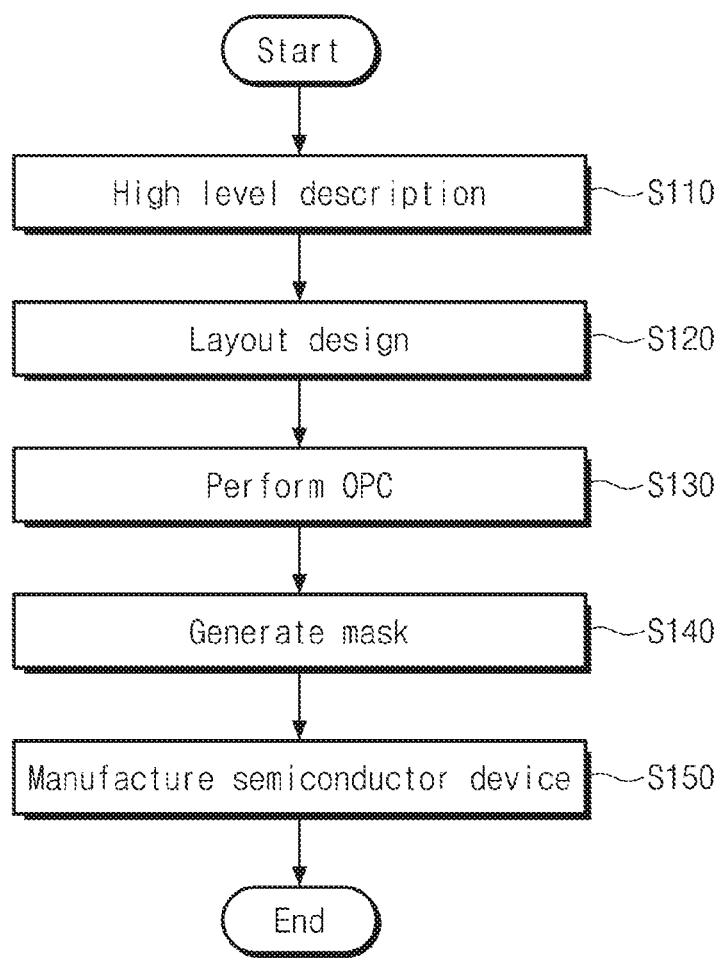
FIG. 15 is a flowchart illustrating a method of designing and manufacturing a semiconductor device according to an example embodiment.

FIG. 15 is a flowchart illustrating a method of designing and manufacturing a semiconductor device according to an example embodiment.

In operation S110, a high level design of a semiconductor integrated circuit may be performed using the layout design system 1000 of FIG. 13. The high level design may mean to describe an integrated circuit targeted for a design with a high-level language of a computer language. For example, C language may be used. Circuits designed by the high level design may be expressed in more detail compared to register transfer level (RTL) coding or simulation. In addition, a code generated by the RTL coding may be converted into a netlist, and the netlist may be composed to a semiconductor device. The composed schematic circuit may be verified by the simulation tool 1220, and an adjustment process may be accompanied depending on a result of the verification.

In operation S120, a layout for implementing a semiconductor integrated circuit, which is logically completed, on a silicon substrate may be designed. For example, the layout design may be performed with reference to the schematic circuit composed in the high level design or the netlist corresponding to the schematic circuit. The layout design may include two steps, placement and routing. The first step, placement, involves deciding where to place various standard cells provided in a cell library depending on a prescribed design rule. The second step, routing, involves connecting the standard cells. In the layout design according to an example embodiment, switch cells may be placed to have a honeycomb pattern.

A cell library for expressing a circuit of a specific gate level with a layout may be defined in a layout design tool. The layout may be the procedure of defining the size or shape of a pattern for transistors and conductive lines that will be actually formed on a silicon substrate. For example, to form an inverter circuit on the silicon substrate actually, layout patterns such as a PMOS transistor, a NMOS transistor, an N-well, a gate electrode, and conductive lines to be placed thereon may be appropriately placed. To this end, an inverters defined in a cell library may be selected through a search. Afterwards, the routing may be performed on the selected and placed standard cells. The series of processes described above may be automatically or manually performed by the layout design tool.

After the routing, verification may be performed to determine whether a portion violating a design rule is present in the design. For example, the verification operation may include design rule check (DRC) for verifying whether a layout is designed to correspond to a design rule, electronical rule check (ERC) for verifying whether electrical disconnection is present in the layout, layout vs schematic (LVS) for determining whether the layout is matched with a gate-level netlist.

In operation S130, optical proximity correction (OPC) may be performed. The layout patterns obtained through the layout design may be implemented on the silicon substrate by using a photolithography process. Here, the OPC may refer to a technique for correcting distortion occurring in the photolithography process. That is, the distortion such as refraction due to a characteristic of light in an exposure process using the designed layout pattern, or process effect may be corrected through the OPC. Shapes and locations of the designed layout patterns may be finely changed while perform the OPC.

In operation S140, photomasks may be manufactured based on the layout changed by the OPC. In general, the photomasks may be manufactured in a way to depict the layout patterns by using a chrome thin layer coated on a glass substrate.

In operation S150, a semiconductor device may be manufactured by using the manufactured photomasks. In the process of manufacturing the semiconductor device by using the photomasks, exposure and etching processes of various manners may be repeated. Through such processes, patterns determined upon designing the layout may be sequentially formed on the silicon substrate.

Figure 16:
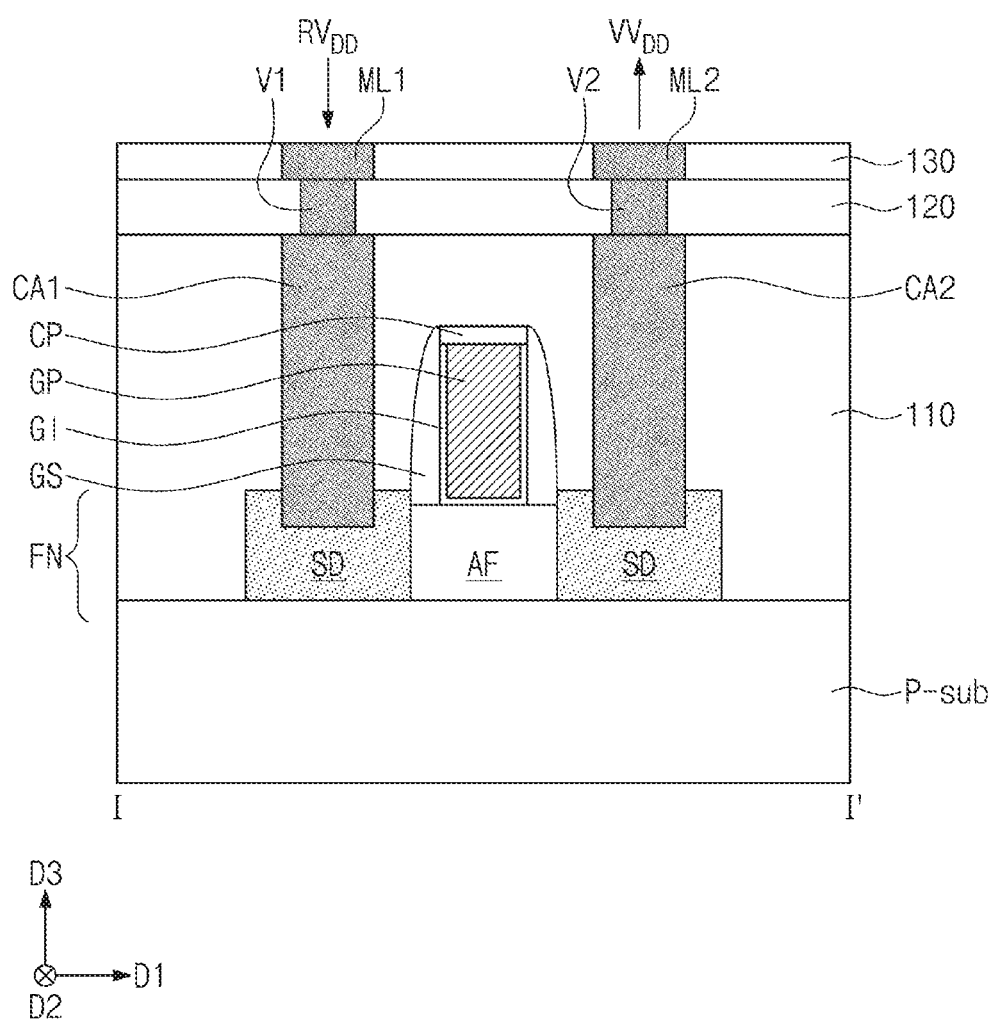
FIG. 16 is a sectional view taken along a line I-I' of FIG. 2.
Figure 17:
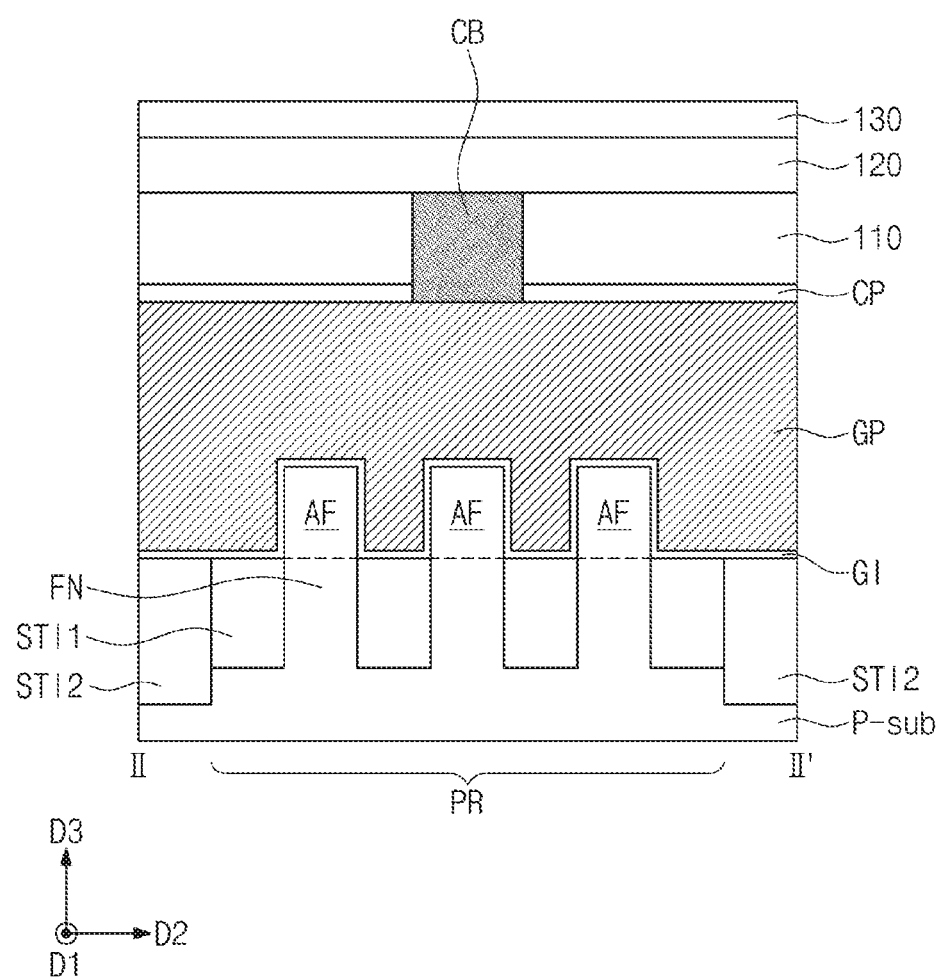
FIG. 17 is a sectional view taken along a line II-II' of FIG. 2.
Figure 18:
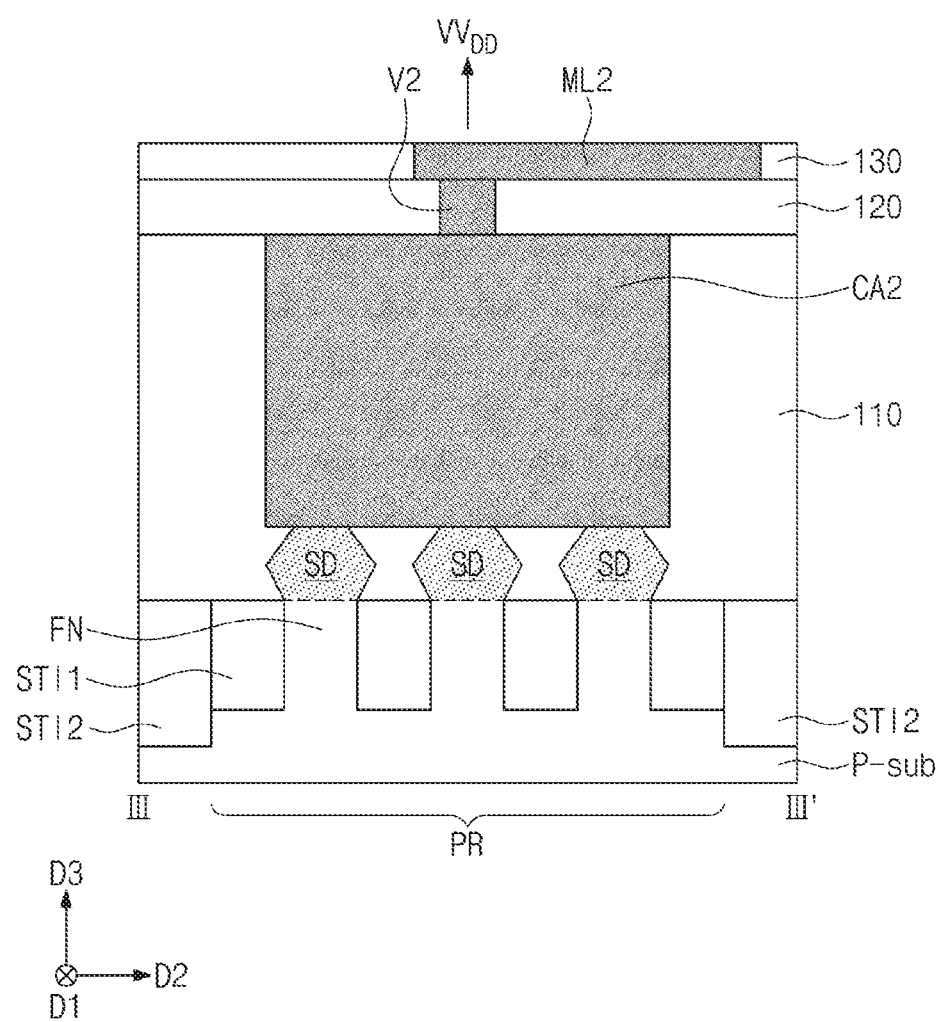
FIG. 18 is a sectional view taken along a line III-III' of FIG. 2.

Below, a method of manufacturing a semiconductor device according to an example embodiment will be described. In detail, a method of manufacturing a switch cell of a semiconductor device will be described. FIG. 16 is a sectional view taken along a line I-I' of FIG. 2. FIG. 17 is a sectional view taken along a line II-II' of FIG. 2. FIG. 18 is a sectional view taken along a line III-III' of FIG. 2.

Referring to FIGS. 2 and 16 to 18, the substrate P-sub may be provided. For example, the substrate P-sub may be a silicon substrate, a germanium substrate, or a silicon on insulator (SOI) substrate. Active patterns FN may be formed on the substrate P-sub. First isolation layers STI1 that fill spaces between the active patterns FN may be formed. Second isolation layers STI2 for defining a PMOSFET region PR may be formed on the substrate P-sub. The first and second isolation layers STI1 and STI2 may be formed by the shallow trench isolation (STI) process. For example, the first and second isolation layers STI1 and STI2 may include a silicon oxide layer.

The first and second isolation layers STI1 and STI2 may have a depth in a direction that is opposite to the third direction D3. For example, the third direction D3 may be a direction perpendicular to an upper surface of the substrate P-sub. For example, a depth of the first isolation layers STI1 may be shallower than that of the second isolation layers STI2. In this case, the first and second isolation layers STI1 and STI2 may be formed by different processes. In another example embodiment, the first and second isolation layers STI1 and STI2 may be formed simultaneously, and the first isolation layers STI1 may have substantially the same depth as the second isolation layers STI2.

Gate electrodes GP that intersect the active pattern FN and extend in the second direction D2 may be formed on the active pattern FN. The gate electrodes GP may be formed to be spaced apart from each other in the second direction D2. A gate insulating pattern GI may be formed under each gate electrode GP, and gate spacers GS may be formed on opposite sides of each gate electrode GP. In addition, a capping pattern CP covering an upper surface of the gate electrodes GP may be formed. A first interlayer insulating layer 110 covering the gate electrodes GP may be formed.

The gate electrodes GP may include at least one of doped semiconductor, metal, conductive metal nitride. The gate insulating pattern GI may include a silicon oxide layer and a silicon oxynitride layer or may include a high-k dielectric layer, of which a dielectric constant is higher than a silicon oxide layer. Each of the capping pattern CP and the gate spacers GS may include at least one of a silicon oxide layer, a silicon nitride layer, and a silicon oxynitride layer. The first interlayer insulating layer 110 may include a silicon oxide layer or a silicon oxynitride layer.

Source/drain regions SD may be formed in the active pattern FN so as to be placed at opposite sides of each of the gate electrodes GP. The source/drain regions SD may be p-type or n-type dopant regions.

The source/drain regions SD may be epitaxial patterns formed by an epitaxial growth process. The source/drain regions SD may include a semiconductor element different from the substrate P-sub. For example, the source/drain regions SD may include a semiconductor element that has a lattice constant greater than or smaller than a lattice constant of a semiconductor element of the substrate P-sub. Because the source/drain regions SD includes a semiconductor element different from a semiconductor element included in the substrate P-sub, compressive stress or tensile stress may be applied to channel regions AF between the source/drain regions SD. For example, when the substrate P-sub is a silicon substrate, the source/drain regions SD of the PMOSET region PR may include embedded silicon-germanium (SiGe) or germanium. Here, the source/drain regions SD may provide the compressive stress to the channel regions AF.

Alternatively or additionally, a semiconductor device may further include a switch cell that is an NMOS transistor. In this case, source/drain regions SD of an NMOSFET region may include silicon carbide (SiC), and thus, the tensile stress may be applied to channel regions. As a result, the mobility of carriers generated in the channel regions AF may be improved.

Source/drain contacts CA1 and CA2 may be formed between the gate electrodes GP. The source/drain contacts CA1 and CA2 may be directly connected to the source/drain regions SD for electrical connection. The source/drain contacts CA1 and CA2 may be provided in the first interlayer insulating layer 110. At least one of the source/drain contacts CA1 and CA2 may connect the source/drain regions SD placed in parallel in the first direction D1.

Gate contacts CB may be formed on the first interlayer insulating layer 110. Each of the gate contacts CB may be directly connected to the gate electrode GP through the capping pattern CP. Lower surfaces of the gate contacts CB may be higher than lower surfaces of the source/drain contacts CA. In addition, the lower surfaces of the gate contacts CB may be higher than upper surfaces of the source/drain regions SD. A switch cell may be driven by applying a bias voltage to the gate pattern GP through the gate contact CB.

A second interlayer insulating layer 120 may be formed on the first interlayer insulating layer 110. A first inner via V1 that passes through the second interlayer insulating layer 120 may be formed. The first inner via V1 may be electrically connected with the source/drain contact CA1, and a second inner via V2 may be electrically connected with the source/drain contact CA2. A third interlayer insulating layer 130 may be formed on the second interlayer insulating layer 120.

A first inner metal line ML1 and a second inner metal line ML2 may be formed in the third interlayer insulating layer 130. The first inner metal line ML1 electrically connects the first via V11 (refer to FIG. 1) and the first inner via V1. Alternatively, the first inner via V1 may not be formed, and the first via V11 and the first inner via V1 may be directly connected to each other. The second inner metal line ML2 electrically connects the virtual voltage line 132 and the second inner via V2. Alternatively, the second inner via V2 may not be formed, and the virtual voltage line 132 and the second inner via V2 may be directly connected to each other.

Figure 19:
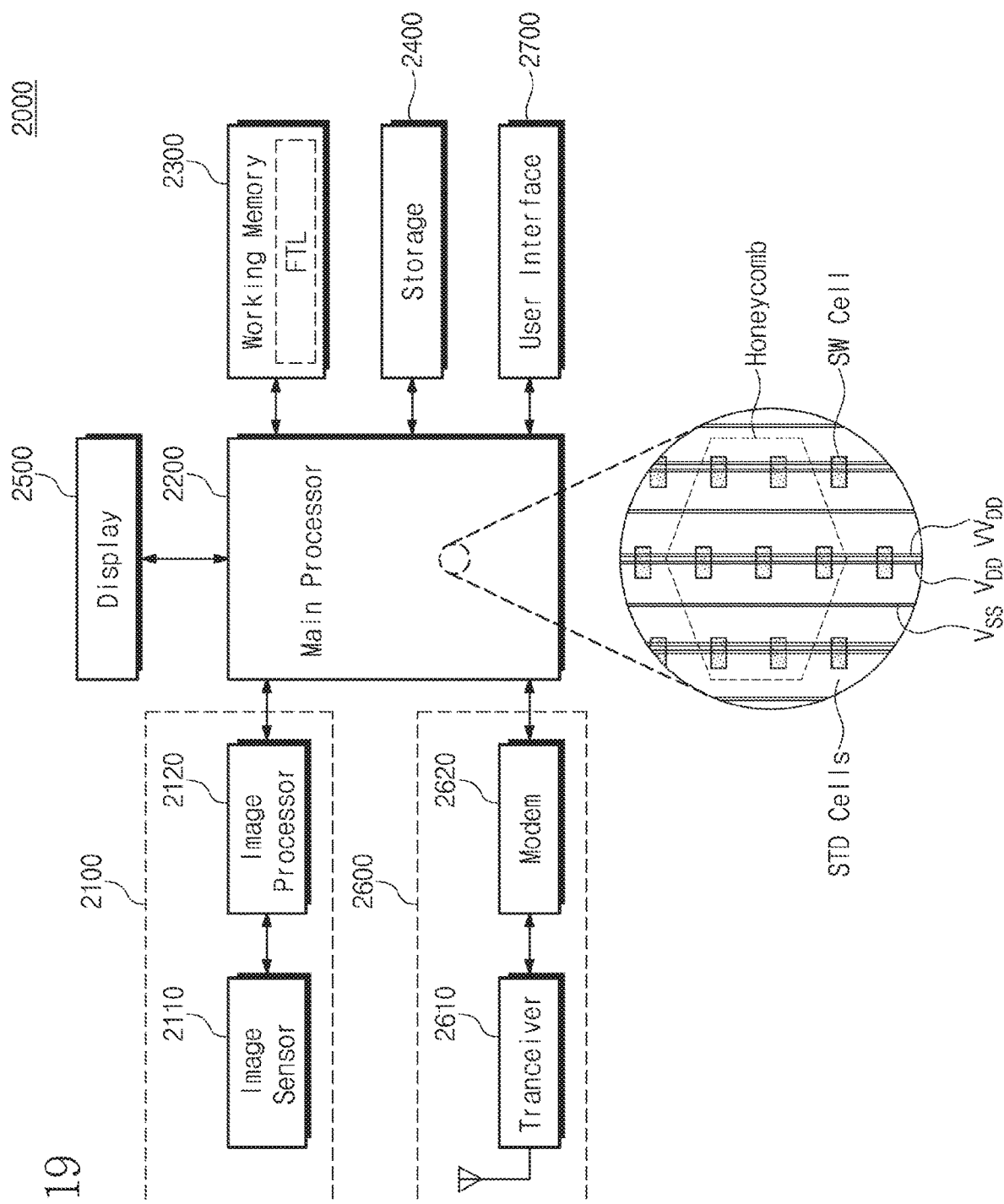
FIG. 19 is a block diagram illustrating an electronic device including a layout of switch cells according to an example embodiment.

FIG. 19 is a block diagram illustrating an electronic device including a layout of switch cells according to an example embodiment. For example, an electronic device 2000 may be implemented with a smartphone, a tablet computer, a desktop computer, a laptop computer, or a wearable device.

The electronic device 2000 may include an image processing device 2100, a main processor 2200, a working memory 2300, storage 2400, a display 2500, a communication block 2600, and a user interface 2700.

The image processing device 2100 may include an image sensor 2110 for photographing an image and an image processor 2120 for processing the photographed image.

The main processor 2200 may control overall operations of the electronic device 2000. The main processor 2200 may drive an OS that is based on a file system. The main processor 2200 may include standard cells for implementing logic blocks that perform various functions. In addition, the main processor 2200 may include switch cells for providing the virtual voltage $VV_{DD}$ to the standard cells. For example, the switch cells of the main processor 2200 may be placed/formed depending on the above-described example embodiments. For example, the switch cells may form a honeycomb pattern as illustrated in FIG. 19.

The working memory 2300 may temporarily store data used for an operation of the electronic device 2000. For example, the flash translation layer FTL that defines a mapping relationship between logical addresses and physical addresses of data stored in the storage 2400 may be loaded to the working memory 2300. For example, the working memory 2300 may include a volatile memory, such as a dynamic random access memory (DRAM) a synchronous DRAM (SDRAM), or the like, and/or a nonvolatile memory, such as a phase-change RAM (PRAM), a magneto-resistive RAM (MRAM), a resistive RAM (ReRAM), a ferroelectric RAM (FRAM), or the like.

The storage 2400 may store data. For example, the storage 2400 may include a nonvolatile memory device such as a flash memory, a PRAM, a MRAM, a ReRAM, or a FRAM.

The display 2500 may include a display panel and a display serial interface (DSI) peripheral circuit. For example, the display panel may be implemented with various devices such as a liquid crystal display (LCD) device, a light emitting diode (LED) display device, an organic LED (OLED) display device, an active matrix OLED (AMO-LED) display device, and the like. A DSI host embedded in the main processor 2200 may perform serial communication with the display panel through a DSI. The DSI peripheral circuit may include a timing controller, a source driver, and the like, which are needed to drive the display panel.

The communication block 2600 may exchange signals with an external device/system through an antenna. A transceiver 2610 and a modulator/demodulator (MODEM) 2620 of the communication block 2600 may process signals exchanged with the external device/system, in compliance with a wireless communication protocol such as long term evolution (LTE), worldwide interoperability for microwave access (WiMax), global system for mobile communication (GSM), code division multiple access (CDMA), Bluetooth, near field communication (NFC), wireless fidelity (Wi-Fi), or radio frequency identification (RFID).

The user interface 2700 may include at least one input interface such as a keyboard, a mouse, a keypad, a button, a touch panel, a touch screen, a touch pad, a touch ball, a gyroscope sensor, a vibration sensor, and an acceleration sensor.

Components of the electronic device 2000 may exchange data based on one or more of various interface protocols such as a universal serial bus (USB), a small computer system interface (SCSI), peripheral component interconnect express (PCIe), mobile PCIe (M-PCIe), advanced technology attachment (ATA), parallel ATA (PATA), serial ATA (SATA), a serial attached SCSI (SAS), integrated drive electronics (IDE), enhanced IDE (EIDE), nonvolatile memory express (NVMe), and universal flash storage (UFS).

According to example embodiments, a virtual voltage may be effectively supplied to standard cells by disposing switch cells effectively.

In addition, according to example embodiments, interconnections for supplying a virtual voltage and a ground voltage may be simplified.

While example embodiments have been shown and described above, it will be apparent to those skilled in the art that various changes and modifications could be made without departing from the scope of the present disclosure.

What is claimed is:

1. A semiconductor device comprising:
a first switch cell and a second switch cell that are disposed on a substrate and spaced apart from each other along a first direction and a second direction that is perpendicular to the first direction;
a first metal line that is electrically connected to the first switch cell and extends in the second direction;
a second metal line that is electrically connected to the second switch cell and extends in the second direction;
a third metal line that is interposed between the first metal line and the second metal line and extends in the second direction;
a first global metal line that extends in the first direction, at least partially overlaps the first switch cell and the second switch cell in a plan view, and electrically connects the first metal line and the second metal line, the first global metal line being configured to receive a power supply voltage; and
a second global metal line that extends in the first direction, is adjacent to the first global metal line in the second direction in the plan view, and is electrically connected to the third metal line, the second global metal line being configured to receive a ground voltage.

2. The semiconductor device of claim 1, further comprising:
a first stack via that is electrically connected to the first metal line and the first global metal line;
a second stack via that is electrically connected to the second metal line and the first global metal line; and
a third stack via that is electrically connected to the third metal line and the second global metal line.

3. The semiconductor device of claim 2, further comprising:
a first via that is electrically connected to the first metal line and the first switch cell; and
a second via that is electrically connected to the second metal line and the second switch cell.

4. The semiconductor device of claim 1, further comprising:
a ground line that extends in the first direction below the third metal line in the plan view; and
a third via that is electrically connected to the third metal line and the ground line.

5. The semiconductor device of claim 1, further comprising a fourth metal line and a fifth metal line extending in the second direction,
wherein the first switch cell is configured to output a virtual voltage to the fourth metal line, and
wherein the second switch cell is configured to output the virtual voltage through the fifth metal line.

6. The semiconductor device of claim 5, further comprising:

a fourth via that is electrically connected to the first switch cell and the fourth metal line; and a fifth via that is electrically connected to the second switch cell and the fifth metal line.

7. The semiconductor device of claim 1, wherein the second global metal line does not overlap the first switch cell and the second switch cell in the plan view.

8. The semiconductor device of claim 1, wherein the first switch cell comprises one or more first transistors formed on a plurality of first N-wells that extend in the first direction and are adjacent in the second direction, and wherein the second switch cell comprises one or more second transistors formed on one or more second N-wells that extend in the first direction and are adjacent in the second direction.

9. The semiconductor device of claim 1, wherein the first metal line, the second metal line and the third metal line are formed at a first level from the substrate, and wherein the first global metal line and the second global metal line are formed at a second level from the substrate.

10. The semiconductor device of claim 1, wherein the first switch cell and the second switch cell are based on a P-channel metal-oxide-semiconductor (PMOS) transistor.

11. The semiconductor device of claim 10, further comprising:

a tap cell that is formed in an N-well adjacent to the first switch cell or the second switch cell in the second direction; and a sixth via that is electrically connected to the tap cell and the first metal line.

12. A semiconductor device comprising:

a first switch cell and a second switch cell that are disposed on a substrate and spaced apart from each other;

a first global metal line that extends in a first direction and at least partially overlaps the first switch cell and the second switch cell in a plan view, the first global metal line being configured to supply a power supply voltage to the first switch cell via a first metal line that extends in a second direction that intersects the first direction and the second switch cell via a second metal line that extends in the second direction; and a second global metal line that extends in the first direction and is adjacent to the first global metal line in the second direction, the second global metal line being configured to supply a ground voltage to standard cells formed on the substrate, wherein the second switch cell and the first switch cell are formed over different wells formed in the substrate.

13. The semiconductor device of claim 12, wherein the first metal line intersects the first switch cell in the plan view, wherein the second metal line intersects the second switch cell in the plan view, and wherein the semiconductor device further comprises a third metal line that is interposed between the first metal line and the second metal line, extends in the second direction, and is electrically connected to the second global metal line.

14. The semiconductor device of claim 13, further comprising:

a first stack via electrically that is connected to the first metal line and the first global metal line;

a second stack via electrically that is connected to the second metal line and the first global metal line; and a third stack via electrically that is connected to the third metal line and the second global metal line.

15. The semiconductor device of claim 13, further comprising:

a first via electrically that is connected to the first metal line and the first switch cell; and a second via electrically that is connected to the second metal line and the second switch cell.

16. The semiconductor device of claim 12, further comprising a fourth metal line and a fifth metal line that extend in the second direction, wherein the first switch cell is configured to output a virtual voltage through the fourth metal line, and wherein the second switch cell is configured to output the virtual voltage through the fifth metal line.

17. The semiconductor device of claim 12, wherein the second global metal line does not overlap the first switch cell and the second switch cell in the plan view.

18. A semiconductor device comprising:

a first switch cell including a plurality of first transistors formed on a plurality of first N-wells, the plurality of first N-wells extending in a first direction on a substrate along a second direction perpendicular to the first direction;

a second switch cell including a plurality of second transistors formed on a plurality of second N-wells, the plurality of second N-wells extending in the first direction on the substrate along the second direction;

a first global metal line that extends in the first direction and at least partially overlaps the first switch cell and the second switch cell in a plan view, the first global metal line being configured to apply a power supply voltage to the first switch cell via a first metal line that extends in the second direction and the second switch cell via a second metal line that extends in the second direction; and a second global metal line that extends in the first direction and is adjacent to the first global metal line in the second direction, the second global metal line being configured to apply a ground voltage to standard cells formed on the substrate.

19. The semiconductor device of claim 18, further comprising:

a first metal line that extends in the second direction, intersects the first switch cell, and is electrically connected to the first switch cell and the first global metal line;

a second metal line that extends in the second direction, intersects the second switch cell, and is electrically connected with the second switch cell and the first global metal line; and a third metal line that is interposed between the first metal line and the second metal line, extends in the second direction, and is electrically connected to the second global metal line.

20. The semiconductor device of claim 19, further comprising:

a first stack via that is electrically connected to the first metal line and the first global metal line;

a second stack via that is electrically connected to the second metal line and the first global metal line; and a third stack via that is electrically connected to the third metal line and the second global metal line.

* * * * *